United States Patent [19]

Yamada et al.

[11] Patent Number: 4,755,974
[45] Date of Patent: Jul. 5, 1988

[54] CONTENT-ADDRESSABLE MEMORY

[75] Inventors: Hachiro Yamada, Tokyo; Kousuke Takahashi, Tokyo, both of Japan

[73] Assignee: NEC Corporation, Tokyo, Japan

[21] Appl. No.: 793,388

[22] Filed: Oct. 31, 1985

[30] Foreign Application Priority Data

Oct. 31, 1984 [JP] Japan .................. 59-229512

[51] Int. Cl.⁴ ............................................. G11C 13/00
[52] U.S. Cl. ..................................... 365/49; 365/189; 364/200
[58] Field of Search .......................... 365/49, 189, 230; 364/200

[56] References Cited

U.S. PATENT DOCUMENTS 3,699,545 10/1972 Kluge .................................... 365/49
4,045,781 8/1977 Levy et al. ........................... 365/49

Primary Examiner—Terrell W. Fears
Attorney, Agent, or Firm—Sughrue, Mion, Zinn, Macpeak, and Seas

[57] ABSTRACT

A content-addressable memory device for searching the address of an input data is disclosed.

The content-addressable memory device comprises:
memory means including a matrix of memory cells including a plurality of pairs of columns, the row position of each of the memory cells corresponding to the content of the data, the position of each of the pairs of columns corresponding to the address, the first column of each pair of columns being for storing the data at the exact address and the second column of each pair of columns being for storing the data close to the data stored in the first column of the same pair of columns;

row selecting means coupled to said memory means and for selecting a row of the memory cell matrix of said memory means corresponding to the input data to be searched.

The content-addressable memory device may further comprise:

column selecting means for, in response to an input data to be stored in an input address, selecting a pair of columns of the matrix of said memory means corresponding to said input address; and data writing means for writing the input data to be stored in the first column of the pair of columns of said matrix selected by the column selecting means and the data associated to said input data in the second column of the pair of columns selected by the column selecting means, whereby it is possible to store data and it's associated data in the same address so as to carry out search of the associated data at high execution speed.

44 Claims, 14 Drawing Sheets

FIG. 2

| | | |
|---|---|---|
| 0 | 0 | 0 |
| 1 | 0 | 1 |
| 2 | 0 | 1 |
| 3 | 1 | 0 |
| 4 | 0 | 0 |
| 5 | 0 | 0 |
| 6 | 0 | 0 |
| 7 | 0 | 1 |

FIG. 3

| Read Out Signal | Hamming Distance |
|---|---|
| 1, 0 | H = 0 |
| 0, 1 | H = 1 |
| 0, 0 | H ≥ 2 |

FIG. 8

| Row | 2Jth COLUMN | (2J+1)th COLUMN | Block |
|---|---|---|---|
| 0 | 0 | 0 | 0th BLOCK |
| 1 | 0 | 1 | |
| 2 | 0 | 1 | |
| 3 | 1 | 0 | |
| 4 | 0 | 0 | |
| 5 | 0 | 0 | |
| 6 | 0 | 0 | |
| 7 | 0 | 1 | |
| 0 | 0 | 0 | 1st BLOCK |
| 1 | 0 | 1 | |
| 2 | 0 | 0 | |
| 3 | 0 | 0 | |
| 4 | 0 | 1 | |
| 5 | 1 | 0 | |
| 6 | 0 | 0 | |
| 7 | 0 | 1 | |
| 0 | 0 | 1 | 2nd BLOCK |
| 1 | 1 | 0 | |
| 2 | 0 | 0 | |
| 3 | 0 | 1 | |
| 4 | 0 | 0 | |
| 5 | 0 | 1 | |
| 6 | 0 | 0 | |
| 7 | 0 | 0 | |
| 0 | 1 | 0 | 3rd BLOCK |
| 1 | 0 | 1 | |
| 2 | 0 | 1 | |
| 3 | 0 | 0 | |
| 4 | 0 | 1 | |
| 5 | 0 | 0 | |
| 6 | 0 | 0 | |
| 7 | 0 | 0 | |

CONTENT-ADDRESSABLE MEMORY

FIELD OF THE INVENTION

The present invention relates to a content-addressable memory or a memory device which is capable of addressing according to memory contents.

DESCRIPTION OF RELATED ART

A variety of content-addressable memories (CAMs) are at present used as an important component of computers for different purposes. In some application, a CAM is used to memorize the correspondence between sectors of a buffer memory and addresses of a main memory, so that a address mapping from logical address to physical address can be carried out at a high speed by means of memory content search. This type of CAM needs content-addressable memory cells each of which is provided with a circuit for detecting equivalence or coincidence between the memory content and the search information for each memory cell. Accordingly, the memory cells for this CAM are more complicated than those used in a conventional memory device accessed on the basis of the address of a location which stores a desired data. As a consequence, the cost per bit amounts to several ten times as much as that of the conventional memory.

In order to reduce the cost, an improved CAM has been developed in which a conventional memory cells are used for the store of information and one equivalence detecting circuit is provided for every word unit. However, this type of CAM still is disadvantageous in that search operations have to be executed the times corresponding to the bit number of each word.

As an example of further improvement, there has been proposed another CAM composed of two conventional memories: the first memory stores data by using search information as an address input, while the second memory receives data or the read-out output from the first memory as an address input and stores search information. This type of CAM is disclosed in Japanese Patent Laid-Open No. 73039/74. It is advantageous that the CAM is constructed only with conventional memory cells. The CAM has, however, such an disadvantage that the number of necessary memory cells is rapidly increased with increase in the bit number of search information or data, resulting in extreame elevation of cost.

On the other hand, a CAM having a character of ambiguity is desired for applications to fields of pattern recognition or natural language processing. In other words, such a CAM is desirable to be capable of searching data within a given Hamming distance. In the prior art, such a search was performed by introducing an error correcting code. Therefore, the construction of the CAM became complicated, which resulted in the increase of cost.

SUMMARY OF THE INVENTION

Accordingly, it is an object of the present invention to provide a content-addressable memory (CAM) dissolving the problems of the prior art mentioned above.

It is another object of the present invention to provide a CAM of a large memory capacity which operates at a high speed, and has a variety of functions, and which is inexpensively constructed with convential memory cells accessible on the basis of address.

It is still another object of the present invention to provide a CAM capable of executing search operation while using a part of search information as a mask.

It is a further object of the present invention to provide a CAM capable of carrying out a multiple matching processing.

It is a still further object of the present invention to provide a CAM capable of easily increasing the memory capacity.

It is an even further object of the present invention to provide a CAM capable of searching for store information within a given Hamming distance from search information.

According to a first aspect of the present, there is provided a content-addressable memory device for searching the address of a input data to be searched comprising:

memory means including a matrix of memory cells including a plurality of pairs of columns, the row position of each of the memory cells corresponding to the content of the data, the position of each of the pairs of columns corresponding to the address, the first column of each pair of columns being for storing the data at the exact address and the second column of each pair of columns being for storing the data closa to the data stored in the first column of the same pair of columns; and row selecting means coupled to said memory means and for, in response to a search operation signal, selecting a row of the memory cell matrix of said memory means corresponding to the search data.

This content-addressable memory device can further comprising;

switching means including a plurality of switches each having a pair of inputs coupled respectively with the first column and the second column of the same pair of columns in the matrix of said memory means so as to receive respectively the content of the memory cell of the first and second columns of each pair belonging to the row selected by the row selecting means, the switching means outputting, in response to a reference signal, the content of the memory cell of at least one column of the first and second columns of each pair belonging to the row selected by the row selecting means; and an encoder receiving the output of the switching means and encoding it to an address for at least one of the search data and the data associated therewith.

In this case, the row selecting means may comprise a decoder receiving the search data and outputting a signal indicating the row of the matrix of said memory means corresponding to the content of the search data.

Preferably, the row selecting means comprises:

a decoder receiving the data and decoding the data to signals corresponding to the row of the memory cell matrix and representing the row position of the memory cell matrix corresponding to the content of the data; and a number of OR gates each having two inputs receiving respectively one of the decoded signals and an operation mode signal indicating the store operation or search operation.

In a specific embodiment, the decoded signal corresponding to the row position of the matrix which corresponds to the content of the data is "1", while the other decoded signals are "0", and the operation mode signal is "1" when the store operation is ordered, while it is "0" when the search operation is ordered.

Further, the content-addressable memory device can comprise:

column selecting means for, in response to a store operation signal, selecting a pair of columns of the matrix of said memory means corresponding to the input address; and data writing means for writing the input data in the first column of the pair of columns of said matrix selected by the column selecting means and the associated data in the second column of the pair of columns selected by the column selecting means.

The above column selecting means can be comprised of a decoder means receiving the input address and outputting a signal indicating the pair of columns of the matrix of the memory means corresponding to the input address. Specifically, the decoder decodes the input address so as to output, in response to a column section original, a signal corresponding to the first and second columns of the pair of columns in the memory cell matrix corresponding to the input address.

The content-addressable memory device further comprises:

a decoder receiving the input address as the upper order signal and a column selection signal as the least significant signal and decoding the same to signals representing the first and second columns of the pairs of columns corresponding to the input address in accordance with the variation of the column selection signal; and a plurality of OR gates each corresponding to the columns of the memory cells of the memory means and receiving the corresponding decoded signal and an inverted operation mode signal.

Preferably, the decoded signals representing the position of the pair of the columns of the matrix corresponding to the input address is "1", while the other decoded signals are "0", and the operation mode signal is "1" when the store operation is ordered, while it is "0" when the search operation is ordered.

In addition, the data writing means can comprises:

a decoder receiving the data and outputting decoded signals in the same number as that of the row of the matrix of the memory means;

means for generating signals corresponding to the associated data; and switching means for, in response to a column selection signal, selectively output the signals corresponding to the data or the associated data.

In this case, prefrably, the decoded signal corresponding to the row position corresponding to the content of the data is "1", while the other decoded signals are "0". Further, the column selection signal is "0" when the first column of the pair of columns of the matrix is selected, while the column selection signal is "1" when the second column of the pair of columns of the matrix is selected. Additionally, the associated data is the data of which the Hamming distance is 1 from the input data.

In accordace with another aspect of the present invention, there is provided a content-addressable memory device for storing an input data and the data associated therewith with the same input address and for searching the addresses of a search data and the associated data therewith. This content-addressable memory device comprises:

memory means including a matrix of memory cells including a plurality of pairs of columns, the row position of each of the memory cells corresponding to the content of the data, the position of each of the pairs of columns corresponding to the address, the first column of each pair of columns and the second column of each pair of columns being for storing the data associated with the data stored in the first column of the same pair of columns;

row selecting means coupled to said memory means and for, in response to a search operation signal, selecting a row of the memory cell matrix of said memory means corresponding to the search data;

column selecting means for, in response to a store operation signal, selecting a pair of columns of the matrix of said memory means corresponding to the input address;

data writing means for writing the input data in the first column of the pair of columns of said matrix selected by the column selecting means and the associated data in the second column of the pair of columns selected by the column selecting means;

reading means for reading the content of the memory cells belonging to the row selected by the row selecting means and outputting the content of the memory cells of the first and second column of each pairs of columns of said selected row sequentially in response to a reference signal; and an encoder receiving the output of the reading means and encoding the content of the memory cells of the first or second column of each pairs of columns in said selected row respectively to the addresses for the search data or the data associated therewith.

In one embodiment, the memory cell matrix is of $2^M \times K$ words by 2N bits and is divided into K memory blocks, so that the input data having the length of MK bits is divided into K pieces of M bit data and the K pieces of data are sequentially stored in the same numbered pair of columns in the respective memory block by cooperation of the row selecting means and the data writing means.

Further, the search data has the length of MK bits and is divided into K pieces of search data which are sequentially applied to the row selecting means. The row selecting means operates to sequentially selecting the respective rows of the K memory blocks corresponding to the K pieces of search data, respectively, and the reading means is a processing means reading the outputs of all the columns of the memory cell matrix for each application of the K pieces of search data and sequentially accumulating the outputs read out at the applications of the K piece of search data for every pair of columns so as to supply the accumulated read-out outputs to the encoder.

In another embodiment, the memory means includes a K memory cell matrixes each being $2^M$ words by 2N bits, each memory cell matrix being associated with a row selecting means and a data writing means so that the input data having the length of MK bits is divided into K pieces of data and the K pieces of data are stored in parallel in the same pair of columns in the respective memory cell matrixes by cooperation of the row selecting means and the data writing means associated to each memory cell matrix.

In addition, the search data has the length of MK bits and is divided into K pieces of search data which are simultaneously applied to the respective row selecting means. The respective row selecting means operate to simultaneously selecting the respective row of the K memory cell matrixes corresponding to the K pieces of search data, respectively. The reading means is a processing means simultaneously receiving the outputs of all the columns of the K memory cell matrixes and examining if the outputs of the same numbered column of the respective memory cell matrixes fulfill as a whole the search condition, so as to supply the search result to the encoder for each column.

In a third emboiment, the memory cell matrix is of $2^M$ words by 2NK bits and is divided into N memory blocks each having 2K columns, so that the input data having the length of MK bits is divided into K pieces of M bits data and the K pieces of data are sequentially stored in the respective pairs of columns in one memory block designated by the input address.

Further, the search data has the length of MK bits and divided into K pieces of search data which are sequentially applied to the row selecting means. The row selecting means responds to each application of the K pieces of search data to select the one row of the memory cell matrix corresponding to the applied search data piece and the column selecting means operates to respond to each application of the K search data pieces so as to incrementally select the columns of each memory block. The reading means is a processing means reading the outputs of the columns of each memory block selected by the column selecting means for each application of the K search data pieces and to sequentially accumulating the outputs read out from each memory block at the application of the K search data pieces so as to supply the search result to the encoder.

In a third aspect of the present invention there is provided a content-addressable memory device for storing N kinds of data each of M bit length and the data associated therewith with a same address i and for searching the addresses of a search data and the associated data therewith. This content-addressable memory device comprises:

memory means including a matrix of memory cells of $2^M$ rows by N pairs of columns, in which an input data with an address i is to be stored as the activation of the memory cell belonging to a j-th row corresponding to the content of the input data and to the first column of the i-th pair of columns of the matrix corresponding to the input address i;

row selecting means coupled to said memory means and for, in response to a search operation signal, selecting the j-th row of the memory cell matrix of said memory means to put accessible the memory cells therein;

column selecting means for, in response to a store operation signal, selecting the i-th pair of columns of the matrix of said memory means to put accessible the memory cells therein;

data writing means for writin the input data by activating the memory cell belonging to the first column of the i-th pair of columns of said matrix selected by the column selecting means and the j-th row of said matrix selected by the row selecting means, and for writing the associated data by activating the memory cell belonging to the second column of the i-th pair of columns of said matrix selected by the column selecting means and to the row of the memory cell matrix of which the position corresponds to the content of the associated data;

reading means for reading the content of the memory cells belonging to the j-th row selected by the row selecting means and outputting the content of the memory cells of the first or second column of each pairs of columns of said selected j-th row sequentially in response to a reference signal; and an encoder receiving the output of the reading means and encoding the content of the memory cells of the first or second column of each pairs of columns of said selected j-th row respectively to addresses for the search data or the data associated therewith.

BRIEF DESCRIPTION OF THE DRAWINGS

FIG. 2 is an illustration of a store pattern in the memory used in the CAM shown in FIG. 1;

FIG. 3 is a table showing the relation between readout signal and Hamming distance;

FIG. 8 is an illustration of a store pattern in the memory shown in FIG. 7;

DESCRIPTION OF THE PREFERRED EMBODIMENTS

Figure 1:
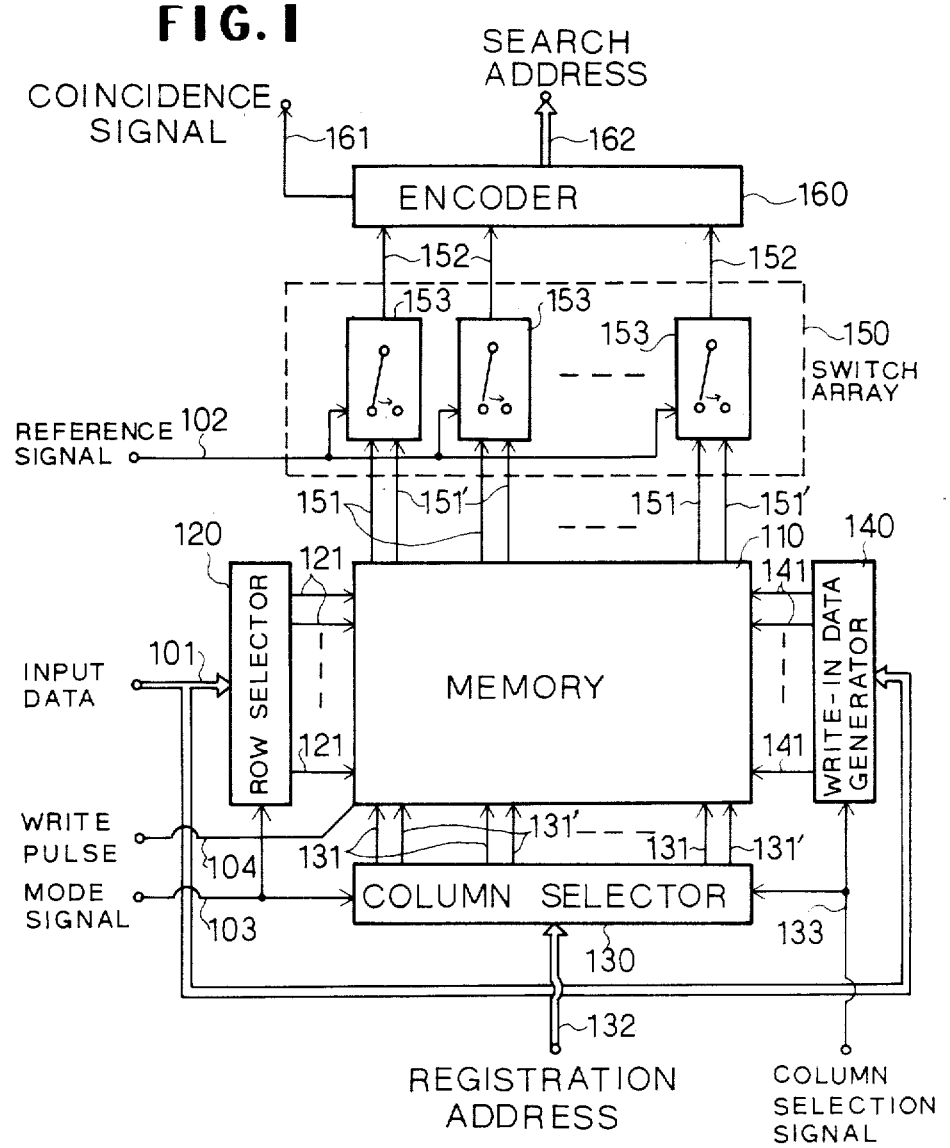
FIG. 1 is a block diagram showing an embodiment of a CAM according to the first aspect of the present invention.

Referring now more specifically to the drawings, FIG. 1 illustrates an embodiment of the CAM according to one aspect of the present invention.

Briefly, the CAM fundamentally comprises a memory cell matrix, and has two basic functions: data store and data search. In response to an operation mode signal, the CAM carries out either the store operation or the search operation. In the store operation, the CAM receives an input data and a registration address, and writes the input data in one column of the memory cell matrix designated by the registration address. In the search operation on the other hand, the CAM receives a search data, and reads out all memory cells in one row of the memory matrix specified by the search data so as to find out a memory cell storing a predetermined bit. Then, the column position of the memory cell storing the predetermined bit is converted into an address, which designates the memory location storing the same data as the search data.

For the purpose, the CAM comprises a memory 110 having a large number of memory cells located in a matrix form and adapted to receive a write timing pulse via a write pulse line 104. Word or row lines of this memory 110 are connected in a one-to-one relation to row selection lines 121 of a row selector 120, which is adapted to receive data via a data bus 101 and an operation mode signal via a line 103. The memory 110 also has bit or column lines connected to column selection lines 131 and 131' of a column selector 130 in such a manner that each pair of adjacent even-numbered and odd-numbered columns of the memory 110 are connected to a corresponding pair of adjacent even and odd column lines 131 and 131'. The column selector 130 is adapted to receive the mode signal via the line 103, a registration address via a address bus 132 and a column selection signal via a column selection line 133. Further, the memory 110 is associated with a write data generator 140 which is adapted to receive the input data on the data bus 101 and the column selection signal supplied via the line 133 so as to selectively activate one or more of write data lines 141 connected to the rows lines of the memory 110, respectively. In addition, the column lines of the memory 110 are connected through read-out lines 151 and 151' to a switch array 150. Each pair of adjacent even and odd read-out lines 151 and 151', which correspond to each pair of adjacent even and odd column selection lines 131 and 131', are respectively connected to two inputs of a corresponding switch 153 in the switch array 150. Each switch 153 of the switch array 150 is controlled on the basis of a reference signal supplied via a line 102 to selectively connect either the read-out line 151 or 151' to an search result line 152 which is connected to an encoder 160 having an coincidence signal line 161 and a search address outputting bus 162.

Specifically, the memory 110 is constructed with conventional memory cells accessed in accordance with address of the data in question. In order to obtain a CAM having a store capacity of N words by M bits, the memory 110 must be constructed with memory cells arrayed in a matrix form with $2^M$ rows by 2N columns. In other words, one column comprises memory cells of $2^M$ corresponding to the number of the kinds of information which can be represented by M bits. Therefore, the first to $2^M$th memory cells in each column can be deemed to correspond to the decimal number (0) to $(2^M-1)$, respectively. On the other hand, a pair of columns correspond to one word, as will become apparent hereinafter.

In the store operation, the row selector 120 drives in parallel all the row selection lines 121, while the column selector 130 selects one pair of adjacent two column selection lines 131 and 131' designated by the registration address on the bus 132, and drives one of selected paired column selection lines 131 and 131' in accordance with the column selection signal from the line 133. In addition, the write data generator 140 receives the input data supplied via the data bus 101 and decodes it into a memory cell position or positions in the row direction specified by the input data in view of the column selection signal on the line 133. Then, the generator 140 selectively supplies a write signal to the write data line or lines 141 corresponding to the decoded memory cell position or positions in the row direction. In the search operation, on the other hand, the row selector 120 drives selectively one of row selection lines 121 designated by the input data or search information 101, while the column selector 130 drives in parallel all the column selection lines 131 and 131' in accordance with the mode signal 103.

The reference signal on the line 102 specifies the search condition: "0" is for search of data identical with the search information 101; "1" is for search of the data whose Hamming distance from the search information 101 is 1. In compliance with such a reference signal 102, all the switches 153 in the switch away 150 operate to selectively connect either the odd column read-out lines 151 or the even column read-out lines 151' of the memory 110 to the corresponding search result lines 152. The encoder 160, which are connected to the search result lines 152 in parallel, operates to encode the position of the search result line or lines 152 activated by the memory 110, to the search address representative of the location of the desired data, which is then outputted to the bus 162. In addition, if at least one of the lines 152 connected to the encoder 160 is activated by the memory 110, an coincidence signal is outputted from the line 161 of the encoder 160.

As for the operational mode signal on the line 103, "1" is for the store operation and "0" is for the search operation. Store operation and search operation will be explained in detail below.

When "1" is applied as the operational mode signal via the line 103 to the row selector 120 and the column selector 130, the store operation starts. The information to be stored is given by the data supplied via the data bus 101, and the address to which the information is to be stored is designated by the registration address supplied via the address bus 132. The column selection signal 133 is given in the order of "0" and then "1". Since "1" is given as the operation signal, the row selector 120 drives in parallel all the row selection lines 121 of the memory 110. The column selector 130 designates one pair of adjacent column selection lines 131 and 131' on the basis of the registration address supplied via the address bus 132, and further selectively drives one column selection line of the designated column selection line pair in accordance with the logical value "0" or "1" of the column selection signal 133: "0" selects the even number column selection line 131 in the left of the designated column selection line pair; "1" selects the odd number column selection line 131' in the right of the designated pair. Since the column selection signal 133 is given in the order of "0" and then "1" as mentioned above, the column selector 130 first drives the even column selection line 131 and then the odd column of the selection line 131' of the column pair of the memory 110 specified by the registration address 132.

FIG. 2 illustrates the content of the memory 110. It also explains the write data generated by the write data generator 140. Of one pair of adjacent columns in the figure, the right one is an odd number column and the left one is an even number column. Numbers 0 to 7 labelled at the left side represent word numbers or row numbers.

Now, function of the write data generator 140 will be explained with reference to FIG. 2. The write data generator 140 receives the input data 101 as the information to be stored, and converts it into write data in accordance with the mode specified by the column selection signal 133 and then applies the data to the memory 110 through the lines 141. For example, when a decimal value "3" is given as the information to be stored, if the column selection signal 133 is "0", the write data generator 140 produces write data corresponding to the even column in the left in FIG. 2, that is, writes "1" in only the 3rd row.

Next, when the column selection signal is changed to "1", the write data generator 140 writes "1" in rows specified by all the data having the Hamming distance 1 from the information supplied via the data bus 101. In the example of FIG. 2, since the memory 110 has 8 rows and the input data 101 consists of 3 bits, the decimal value "3" is represented by "011" in binary notation. In this case, data having the Hamming distance "1" from the information to be stored can be obtained by inverting only one bit of "011". Therefore, there are obtained "010", "001" and "111" which correspond to the decinal members "2", "1" and "7". Consequently, the write data generator 140 applies to the write data lines 141 write data corresponding to the right side odd column of FIG. 2 so as to write "1" in 2nd, 1st and 7th rows. Thus, the write data mentioned above are stored successively in the one pair of adjacent columns of the memory 110 designated by the registration address 132 as shown in FIG. 2. The store operation is then finished. As seen from the above, each pair of adjacent columns 131 and 131' corresponds to one word.

In the search operation where "0" is applied as an operational mode signal, search information is given as the input data 101. Further, the reference signal 102 is applied to the switch array 150. Triggered by the operation mode signal 103 of "0", the row selector 120 selectively drives one rows of the memory 110 specified by the search information, while the column selector 130 drives in parallel all columns of the memory 110. Accordingly, the data stored in the selected one row of the memory 110 specified by the search information are outputted via the even and odd read-out lines 151 and 151'. As can be seen in FIG. 2, when the stored information is equal to the search information, read-out signals from one pair of adjacent even column 151 and odd column 151' in the memory 110 become (1,0). When the stored information is different from the search information by only 1 bit, the read-out signals from one pair of adjacent columns 151 and 151' become (0,1); when the difference is 2 bits or more, the read-out signals become (0,0).

FIG. 3 shows the relation between read-out signals from an even column 151 and an odd column 151' and Hamming distance H. When the stored information in the memory 110 is identical with the search information, the Hamming distance His equal to zero. When difference between the stored information and the search information is 1 bit, the Hamming distance H equals to 1; when the difference is 2 bits or more, H is not smaller than 2. Therefore, in each pair of even and odd columns, the read-out signal 151 from an even column indicates whether the information stored in that even column is identical with the search information or not. On the other hand, since an odd column stores the data of the Hamming distance 1 from the information stored in the adjacent left side even column as mentioned above, the read-out signal 151 of an odd column indicates whether the information stored in the adjacent even column is different from the search information by 1 bit or not.

The read-out signals 151 and 151' from each pair of adjacent columns of the memory 110 are applied to the corresponding switch 153 of the switch array 150. According to the reference signal 102, each switch 153 selectively applies either the read-out signal 151 from an even column or the read-out signal 151' from an odd column as a search result signal 152 which is supplied to the encoder 160: when "0" is given as the reference signal 102, the read-out signal 151 from an even column is outputted as the search result signal 152; when "1" is given as the reference signal, the read-out signal 151' from an odd column is outputted as the search result signal. When the search information is identical with the stored information, "1" is outputted as the search result signal 152, if the reference signal is of "0".

When the search result signals 152 inputted in parallel to the encoder 160 includes "1", the encoder 160 outputs to an external apparatus a coincidence signal 161 and converts the position of the column supplying the search result signal of "1", into an address of binary code. The coincidence signal 161 indicates whether or not the information identical with the search information is stored in the memory 110, and the search address 162 indicates the position of the column where the search result signal 152 having "1" is included, i.e., the address of the location storing the information identical with the search information.

In case of multiple coincidence in which a plurality of informations stored in the memory 110 are equal to the search information under the condition specified by the reference signal, a search result signal 152 of "1" is generated from a plurality of switches 153. In compliance with this situation, a register for temporarily storing the search result signal 152 is equipped between each switch 153 and the encoder 160, and there is provided a decoder responsive to the search address 162 to reset the register of the bit position specified by the inputted search address 162. In this case, therefore, the encoder 160 sequentially converts the position of each search result signal having "1" into the search address 162, so that a plurality of search addresses 162 of the stored information equal to the search information can be obtained.

As explained above, a CAM having a capacity of N words by M bits can be constructed by using the memory 110 comprising cheap conventional memory cells arranged in a matrix of $2^M$ rows by 2N columns, and therefore, this type of CAM is very inexpensive. Furthermore, the search operation and the store operation can be respectively carried out with only one memory access step, so that high operation speed can be realized. In addition, the CAM is capable of searching not only memory information identical with the search information but also memory information having Hamming distance "1" from the search information. In other words, multi-functional CAM can be obtained.

Figure 4:
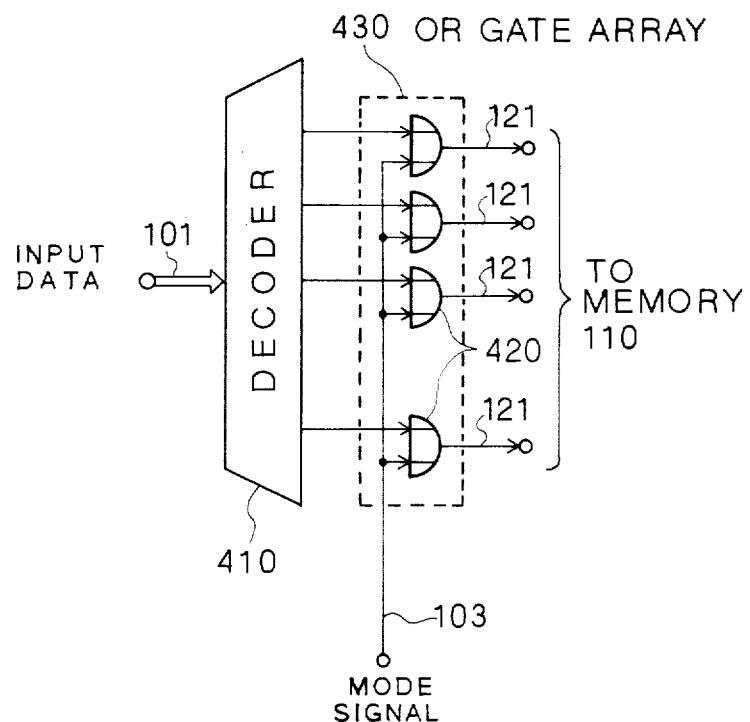
FIG. 4 shows an embodiment of the row selector shown in FIG. 1.

FIG. 4 shows an embodiment of the row selector 120 shown in FIG. 1. The shown row selector 120 comprises a decoder 410 receiving via the data bus 101 the input data which is used as the store information or the search information depending on the mode of operation. This decoder 410 operates to selectively output a binary signal of "1" to one of $2^M$ parallel output lines designated by the input data 101. These parallel output lines of the decoder 410 are respectively connected to one inputs of $2^M$ OR gates 420 which are arranged in parallel to constitute a gate array 430. The other inputs of all the OR gates 420 are connected to the line 103 to receive the mode signal, and the outputs of the respective OR gates 420 are connected to the row selection lines 121 associated with the memory, respectively.

In the store operation, the operation mode signal 103 of "1" is applied to all the OR gates 420, and all the outputs of the OR gates 420 become "1", so that all the row selection lines 121 are driven in parallel. In the search operation, since "0" is applied to the OR gates 420 as the operation mode signal 103, only one selection line 121 specified by the input data 101 is selectively driven.

Figure 5:
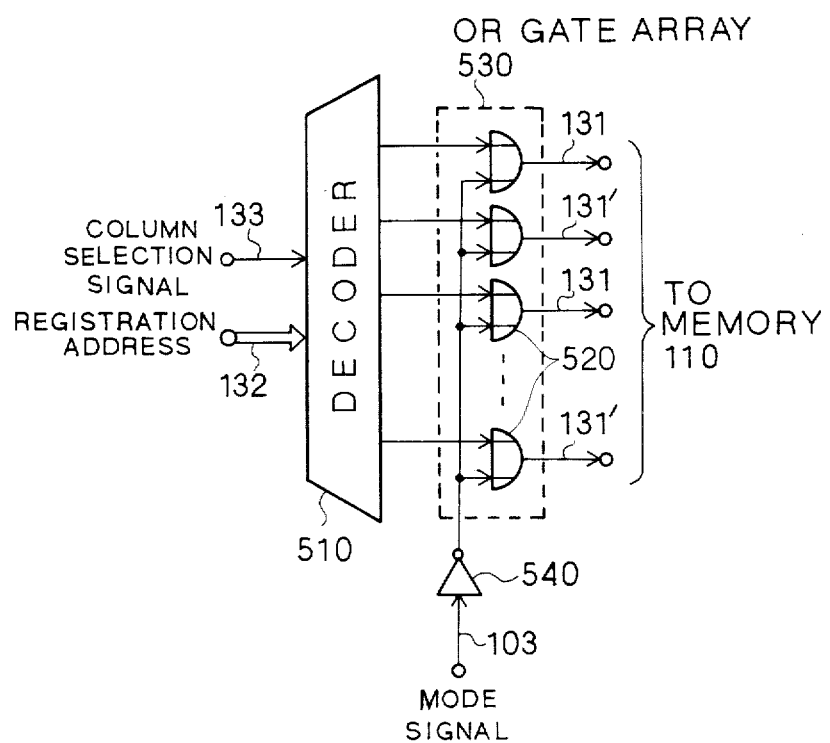
FIG. 5 shows an embodiment of the column selector shown in FIG. 1.

FIG. 5 shows an embodiment of the column selector 130 shown in FIG. 1. The column selector 130 shown in this figure comprises a decoder 510 which receives the column selection signal 133 as the least significant bit and the registration address 132 as higher order bits. This decoder also has N pairs of parallel output lines which are respectively connected to one inputs of 2N parallel OR gate 520 in a gate array 530, and decodes the input signals so as to selectively output a binary signal of "1" to one pair of output lines designate by the input data. The column selector 130 also includes an inverter 540 having an input connected to the line 103 to receive the mode signal and an output connected to the other inputs of all the OR gates 520 so as to supply the inverted mode signal to these OR gates 520. The outputs of the respective OR gates 520 are respectively connected to the column selection lines 131 and 131'.

In the store operation, the operation mode signal 103 of "1" is applied to the inverter 540, and so, the binary signal of "0" is supplied to the other inputs of all the OR gates 520. Therefore, the decoder 510 can selectively drive one of the column selection lines 131 and 131' specified by both the registration address 132 and the column selection signal 133. Since the column selection signal 133 is applied to the decoder 510 as the least significant bit, the column selection signal determines a selection of either an even column or an odd column of each pair of adjacent columns in the memory 110. As mentioned hereinbefore, since the column selection signal 133 is driven in the order of "0" and then "1" in the store operation, the information is written in in the even column and then in the odd column of the one pair of adjacent columns in the memory 110 specified by the registration address 132. In the search operation, since "0" is applied to the inverter 540 as an operation mode signal 103, the inverter 540 outputs the binary signal of "1" to all the OR gates 520 to drive in parallel all the column selection lines 131 and 131' without influenced by the outputs from the decoder 510. Therefore, data of all the columns of the memory 110 can be read out in parallel.

Figure 6:
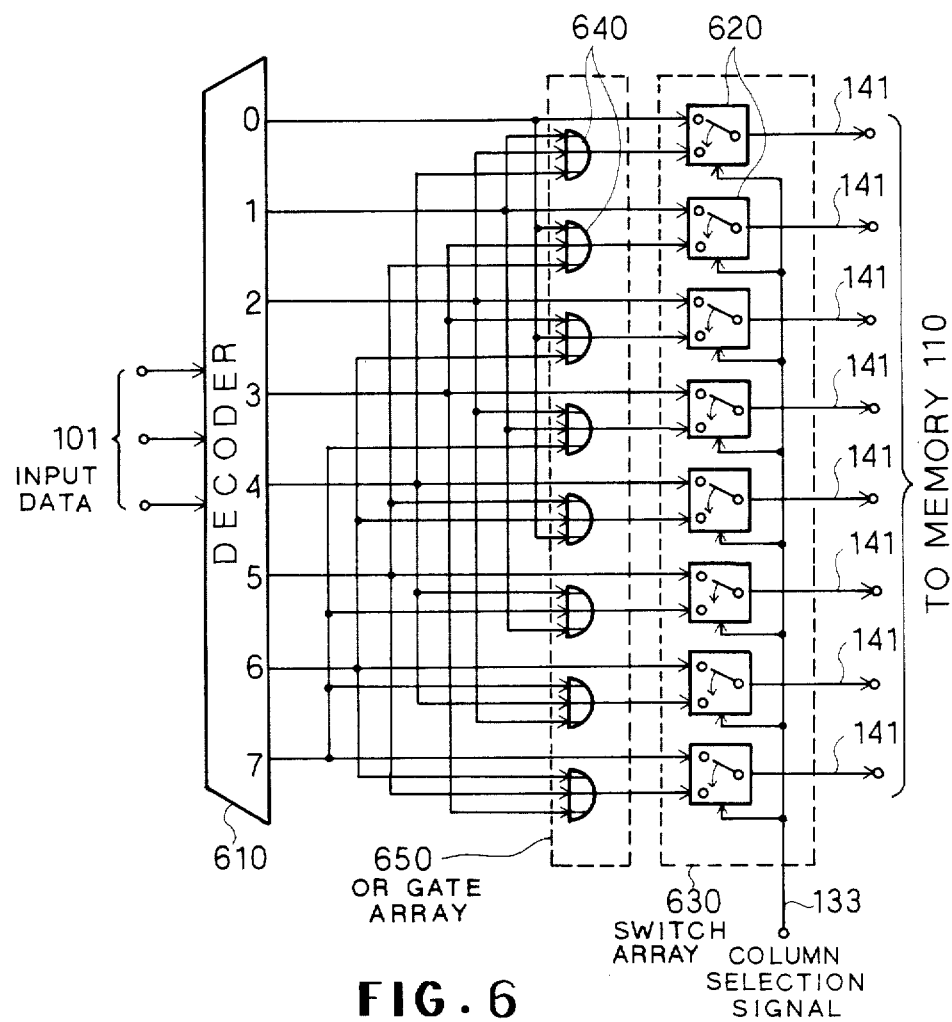
FIG. 6 shows an embodiment of the write data generator shown in FIG. 1.

FIG. 6 shows an embodiment of the write data generator 140 shown in FIG. 1, in the case of a three-bit data bus 101. The write data generator comprises a decoder 610 having an input connected to the data bus 101 to receive the input data as the store information. This decoder 610 has eight output lines and adapted to selectively output a binary signal of "1" to one of the eight output lines designated by the input data 101. The eight output lines of the decoder 610 are connected directly to one inputs of corresponding eight switches 620 arranged in parallel to one another so as to form a switch array 630. Further, the output lines of the decoder 610 are connected via OR gates 640 of a gate array 650 to the other inputs of the switches 620 as shown in FIG. 6. These switches 620 are controlled by the column selection signal supplied via the line 133 so as to connect either their one inputs or their other inputs to their outputs which are connected to the write data lines 141 of the memory 110.

When "0" is applied as the column selection signal 133 to the switches 620, each switch outputs directly each output of the decoder 610 to the write data lines 141 as the write data. In this case, the write data has "1" in only one write data line 141 specified by the store information.

When "1" is applied as the column selection signal 133 to the switches 620, the switches operate to connect the outputs of the OR gates 640 to the write data lines 141. As seen from FIG. 6, the OR gates 640 are connected to the parallel outputs of the decoder 610, so as to generate the write data giving "1"s in the rows designated by all possible data having the Hamming distance "1" from the input data 101 or the store information. If the OR gates 640 and the outputs of the decoder 610 are numbered from "zero" at the highest position in FIG. 6 and to successively increase toward the lowest position, then the third output "3" of the decoder 610 is coupled to the first, second and seventh OR gates 620. Therefore, when "011" (the decimal number 3) is applied as the input data 101, the write data having "1" in the first, second and seventh rows are outputted from the OR gate array 650. This means that the write data has "1"s in the rows designated by data different from the input data 101 by only one bit, that is, by data "001", "010" and "111" which have the Hamming distance "1" from the input data "011", respectively.

Figure 7:
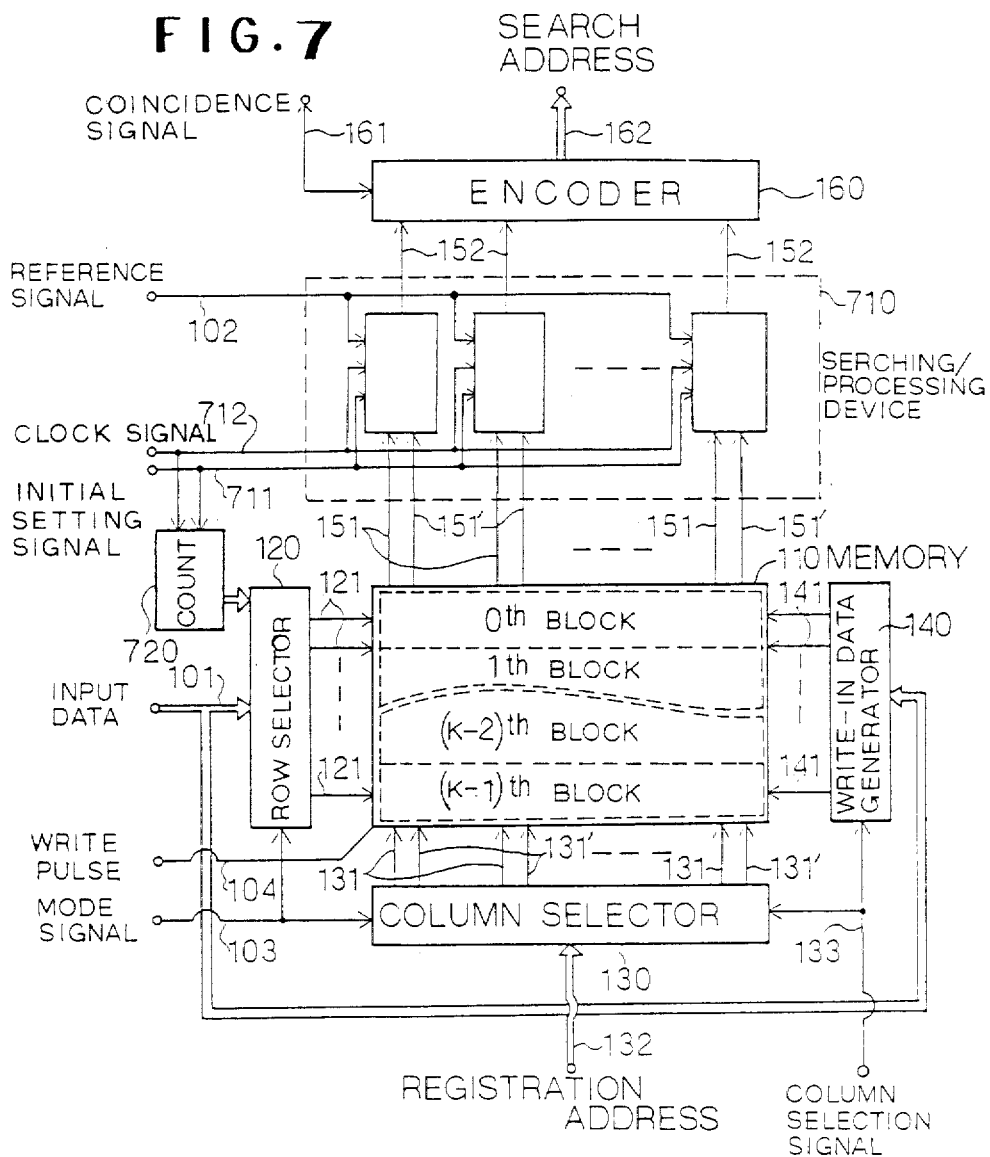
FIG. 7 is a block diagram showing an embodiment of a CAM according to the second aspect of the present invention.

FIG. 7 is a block diagram showing an embodiment of the CAM according to another aspect of the present inventions. This CAM is capable of searching memory information of the bit number larger than that shown in FIG. 1. The CAM is also capable of carrying out the search masking a part of search information. For the purpose, in addition to the equipment of the CAM shown in FIG. 1, a searching and processing device 710 and a counter 720 for the input data 101 are further equipped.

If this CAM has a memory capacity with N words by M×K bits, the memory 110 is constructed with memory cells arranged in a matrix form with $2^M \times K$ rows by 2×N columns. That is, the memory 110 has a memory capacity with $2^M \times K$ words by 2×N bits, and the bit number of the counter 720 is $\log_2 K$ bits. Therefore, the memory 110 in FIG. 7 is composed of K blocks, considering the memory 110 of $2^M$ rows by 2×N columns in FIG. 1 as one block: the K blocks are selectively designated by the counter 720. Search information and store information of M×K bits are divided into K pieces of M bit data, which are then inputted successively to the row selector 120 and to the write data generator 140 in the order from the most significant bit (MSB) data piece to the least significant bit (LSB) data piece in K times, so that the K pieces of input data 101 are separately stored in the corresponding blocks of the memory 110 one data piece in one memory block. For example, the store information A composed of 4 data $A_0, A_1, A_2$ and $A_3$, each having the length of M bits, is separately stored in 4 blocks of the memory 110: data $A_0$ of the 0th block, $A_1$ in the first block, $A_2$ in the second block and $A_3$ in the third block, as shown in FIG. 2.

For ensuring the above mentioned storing manner, the row selector 120 receives the output of the counter 720 as the MSB data portion and the data of the bus 101 as the LSB data portion. In the store operation, the row selector 120 operates to drive all the row in one block of the memory 110 specified by the count value of the counter 720. In the search operation, the row selector 120 operates to selectively drive one row specified by the data of the bus 101, in one block of the memory designated by the memory designed by the count value of the counter 720. In other words, the row selector 120 is adapted to be capable of selectively driving only one row in the memory 110 consisting of K blocks. On the other hand, each write data line 141 of the write data generator 140 is connected to the same placed and corresponding one row of each block. Namely, the write data generator 140 supplies the write data in parallel to all the blocks in the memory 110.

store operation and search operation will be explained in detail. First, explanation will be made on the store operation for storing information A composed of four M-bit data $A_0$, $A_1$, $A_2$ and $A_3$ at an address J: $A_0$ is the MSB data piece and $A_3$ is the LSB data piece of the information A. The MSB data $A_0$ is first applied and then the lower order data $A_1$, $A_2$ and $A_3$ are sequentially applied. After the explanation of the store operation is completed, the search operation will be explained in the case of searching the same information as the stored information A. For both operations, an initial setting signal is applied via a line 711 to the searching and processing device 710 and the counter 720 to initialize these circuits at the beginning of the respective operations.

In the store operation, the operation mode signal 103 of "1" is given when the initial setting signal 711 is given. At the same time, the registration address J is given via the address bus 132. By the initial setting signal, the counter 720 is cleared to output a signal to the row selector 120 so that the row selector 120 designates the 0th block of the memory 110. Next, when the MSB data $A_0$ of store information A is applied via the data bus 101, the write data generator 140 decodes the input data $A_0$. At this time, if the column selection signal 133 is of "0" and the write timing pulse 104 is applied, the write data decoded from the data $A_0$ is stored in the 0th block portion of the 2J-th column of the memory 110. Thereafter, when the column selection signal 133 is changed to "1" and a write timing pulse 104 is further applied at the same time, the 0th block of the (2J+1)-th column of the memory 110 is supplied with the write data which makes it possible to write "1" in the row positions specified by all the data having the Hamming distance "1" from the data $A_0$. Further, when the column selection signal 133 is changed to "1", a clock signal 712 supplied to the counter 720 is brought to the negative and the returned to the positive after the write timing pulse 104, so that the counter 720 is incremented at rising of the clock signal 712. Therefore, at the end of writing the data to the 0th block of the memory 110, the content of the counter 720 is incremented by "1", and the counter then specifies the 1st block of the memory 110 for storing the piece of data $A_1$.

By performing the above operations, the partial data $A_0$ of the store information A is written in the memory 110. The above write operation of partial data is divided into two steps: the first step is executed when the input data 101, the write timing pulse 104 and the column selection signal 133 of "0" are applied; and the second step is carried out in the condition in which the same input data 101 is maintained, when the write timing pulse 104, the column selection signal 133 of "1" and the negative clock signal 712 are applied. For the perfect store of the information A, the above mentioned write operation is repeated four times for data pieces $A_0$, $A_1$, $A_2$ and $A_3$.

FIG. 8 illustrates one example of data stored in one pair of adjacent columns in the memory 110 used for the CAM shown in FIG. 7. The figure shows the condition in which the above mentioned store information A composed of four partial data $A_0$, $A_1$, $A_2$ and $A_3$ is stored at the register address J. In this example, each block has 8 memory cells in each column so as to store the dicimal numbers "0" to "7" which can be expressed by 3 bits. Therefore, the shown partial data $A_0$, $A_1$, $A_2$ and $A_3$ represent the decimal numbers "3", "5", "1", and "0", respectively. When this store information is stored, data are so stored in the 2J-th and (2J+1)-th rows of the memory 110 as shown in the figure: in the 2J-th column (even number column), "1" is stored at the third row of the 0th block, at the fifth row of the first block, at the first row of the second block and at the 0th row of the third block; in the (2J+1)-th column (odd number column), "1" is stored in all rows corresponding to the Hamming distance 1 from each partial data 3, 5, 1 and 0, respectively, similarly to the method as shown in FIG. 2.

In this way, write operation of each partial data can be performed just as for the CAM shown in FIG. 1.

Next, explanation will be made on operation for searching information A when the same information A is stored at the address J.

In this search operation, "0" is applied as an operation mode signal 103. At the same time, the counter 720 and the searching and processing device 710 are initialized by an initial setting signal 711. Then, partial data $A_0$, $A_1$, $A_2$ and $A_3$ of the search information A are inputted successively via the data bus 101 to the row selector 120, and the clock signals are successively also supplied via the clock signal line 712 to the counter 720 in synchronism with application of the partial data $A_0$–$A_3$, so that the count value of the counter 720 is incremented for each inputted clock signal 712. Thus, the row selector 120 successively drives the 3rd row of the 0th block specified by the data $A_0$, the 5th row of the first block designated by the data $A_1$, the 2nd row of the second block specified by the data $A_2$ and then the 1st row of the third block designated by the data $A_3$. The data signals stored in the row of the memory connected to each row selection line 121 thus driven are read out via the read-out lines 151 and 151' in synchronization with the clock signal 712 for each block. The read-out signals 151 and 151' are then applied to the searching and processing device 710. As mentioned above, since the data are so stored in the memory 110 as shown in FIG. 8, a pair of read-out signals 151 and 151' from the 2J-th column and the (2J+1)-th column will be (1,0) for all the search data $A_0$, $A_1$, $A_2$ and $A_3$.

Next, the above mentioned example is generalized. Assume that as the input data 101 there is applied the search information A which comprises K pieces of M bit partial data $A_0$, $A_1$, ..., $A_i$, ..., $A_{k-1}$ with $A_0$ being the MSB data. Each pair of read-out signals 151 and 151' from the memory 110 for each partial data $A_i$ show the result of comparison between the partial data $A_1$ of the search information A and the partial data encoded by the write data generator 140 and stored in each pair of adjacent columns in the memory 110. Each read-out signal 151 from an even column indicates whether the store information and the search information are identical or not, while each read-out signal 151' from an odd column shows whether or not the store information stored in the adjacent even column has the Hamming distance 1 from the partial data of the search information. Supposing that the read-out signals 151 from an even column and 151' from an odd column are $EV_i$ and $OD_i$ (i=0 to k−1) respectively, the concidence examination result E indicating whether or not the search information A and the store information stored in an even column of each adjacent two columns in the memory 110 are identical, and the Hamming distance examination result H showing whether or not the search information A and the store information are different by only 1 bit, are respectively represented by putting $E=E_{k-1}$ and $H=H_{k-1}$ with the following formulae:

$$E_i = E_{i-1} \cdot EV_i \quad (1)$$

$$H_i = E_{i-1} \cdot OD_i + H_{i-1} \cdot EV_i \quad (2)$$

where i is the number of partial data $A_i$, i=0 to K−1, $E_{-1}=1$ and $H_{-1}=0$.

By the initial setting signal 711, the initial condition is set as i=0, $E_{-1}=1$ and $H_{-1}=0$. The coincidence result E can be obtained by examining the coincidence between the store information and the search information for all partial data in accordance with the formula (1). Through the first term of the formula (2), examination is mode on whether or not the store information stored in the memory 110 is equal to the partial data $A_0$ to $A_{i-1}$ of the search information and at the same time the store information differs from the partial data $A_i$ one bit. Through the second term of the formula (2), one bit difference of the store information from the partial data from $A_0$ to $A_{i-1}$ of the search information and coincidence of the store information to the partial data $A_i$ of the search information are examined. Hamming result H can be obtained through the above two examination steps.

The searching and processing device 710 receives the read-out signals 151 and 151' in synchronism with a clock signal 712 and successively performs the logical operation according to the formulae (1) and (2). Then, the searching and processing device 710 selectively outputs either the coincidence result E or the Hamming result H as a search result signal 152 in dependence of the reference signal 102.

The encoder 160, receiving this search result signal, operate similarly to the CAM in FIG. 1. It generates the coincidence signal 161 indicating whether or not any information identical to the search information is stored in the memory 110, together with the search address 162 indicating the location of the information identical with the search information.

Figure 9:
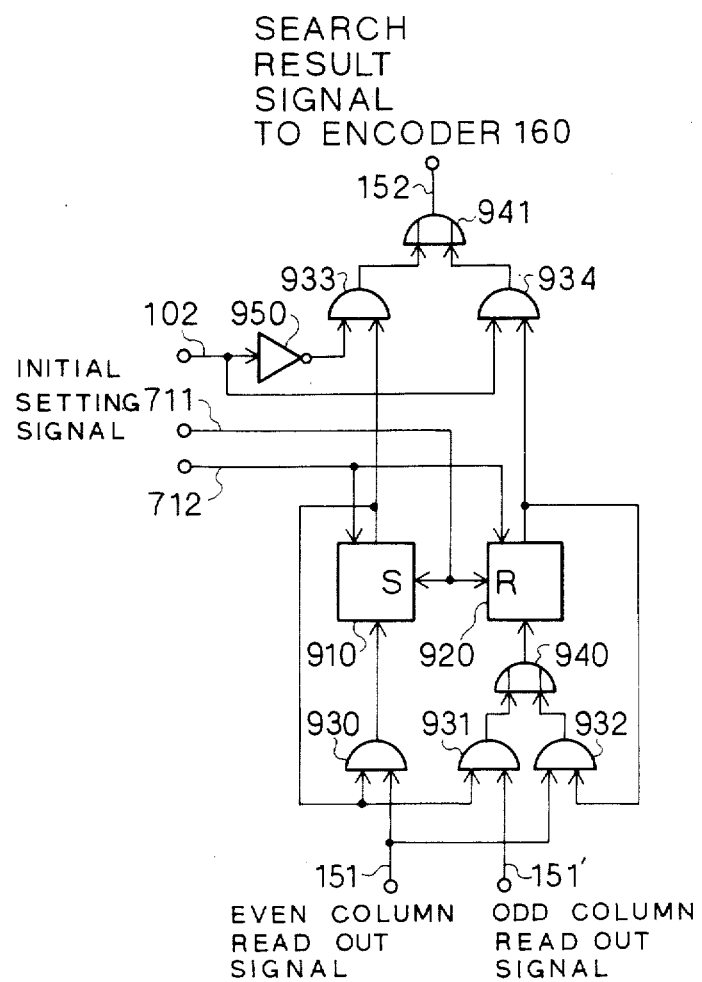
FIG. 9 shows an embodiment of the searching and processing device shown in FIG. 7.

FIG. 9 is a logical circuit diagram showing a fundamental unit of the searching and processing device 710 for generating the search result signal 152. This searching and processing unit comprises first and second one-stage register 910 and 920, five AND gates 930, 931, 932, 933 and 934, two OR gates 940 and 941, and an inverter 950, which are connected as shown in FIG. 9 to ensure that the coincidence result E and the Hamming result H are culculated based on the formulae (1) and (2), and then, either of those results E and H are selectively outputted in accordance with the reference signal 102.

The register 910 is set by the initial setting signal 711 so as to supply an output of the logical value "1", i.e., $E_{-1}=1$, and the register 920 is reset by the same initial setting signal 711 to supply an output signal of the logical value "0", i.e., $H_{-1}=0$. These registers 910 and 920 are clocked with the clock signals 712. Therefore, the AND gate 930, which receives the even column read-out signal 151 and the output of the register 910, executes the logical operation of the formula (1), and the first register 910 updates and holds the result $E_i$ of the logical operation at every clock signal 712. On the other hand, the two AND gates 931 and 932 and the OR gate 940 cooperate to perform the logical operation of the formula (2), and the second register 920 updates and holds the result $H_i$ of the logical operation in synchronism with the clock signal 712. When the read-out signals 151 and 151' for all the partial data are inputted, the coincidence result E and the Hamming result H are held in the registers 910 and 920, respectively.

The outputs of the registers 910 and 920 are connected to one inputs of the AND gates 933 and 934, respectively. The other inputs of these AND gates are supplied with the reference signal via the inverter 950 or directly, respectively. The outputs of the two AND gates 933 and 934 are connected to two inputs of the OR gate 941 whose output is connected to the output line 152 of the searching and processing device. Therefore, the coincidence result E and the Hamming result H held in the two registers 910 and 920 are selective supplied to the output line 152 in accordance with the condition of the reference signal 102: when "0" is inputted as the reference signal 102, the coincidence result E in the first register 910 is outputted and when "1" is inputted as the reference signal 102, the Hamming result H of the second register 920 is outputted.

The explanation so far has been given is on the operation when the search information is not masked. This CAM is capable of searching data by masking search information for each partial data. This operation can be performed by inhibiting the application of the clock signal 712 at the time of outputting the read-out signals 151 and 151' concerning the partial data to be masked, to the searching and processing device 710. If the clock signal 712 to the searching and processing device 710 is blocked when the search result on the partial data $A_i$ is supplied to the device 710, the calculations based on $EV_i$ and $OD_i$ in the formulae (1) and (2) are by-passed, and therefore, the comparison result can be obtained for masked partial data $A_i$.

As explained above, a CAM having a capacity of N words by M ×K bits can be constructed using a conventional memory 110 of $2^M \times K$ words by 2N bits. On the other hand, in the CAM shown in FIG. 1, a conventional memory of $2^{M \times K}$ words by 2N bits is needed as the memory 110 to have the same memory capacity. Therefore, this CAM can be constructed with a smaller number of memory cells, and so, is more inexpensive. Furthermore, this CAM is capable of searching not only the store information equal to the search information but also the store information having Hamming distance 1 from the search information. It is also possible to perform a searching operation masking a part of the search information.

Figure 10:
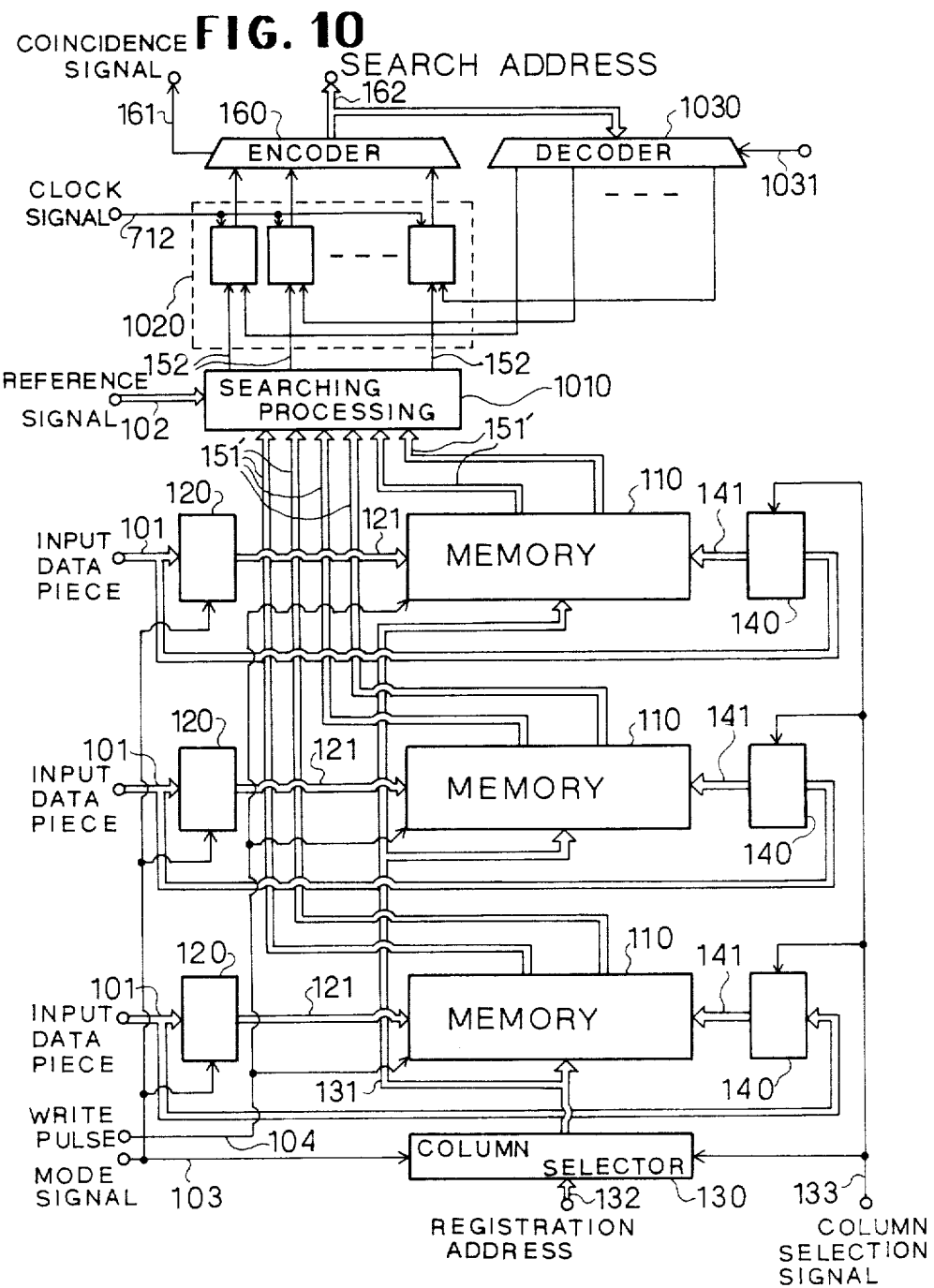
FIG. 10 is a block diagram showing an embodiment of a CAM according to the third aspect of the present invention.

FIG. 10 shows an embodiment of a CAM according to a third aspect of the present invention. This CAM is capable of searching and storing information of a bit number larger than that shown in FIG. 1. The CAM is also capable of doing the search and store operation at a speed higher than that shown in FIG. 7. The CAM is further capable of multiple matching processing. Because of these differences from the CAM shown in FIG. 1, the CAM of FIG. 10 has some modifications. The CAM comprises a plurality of memories 110 each constituting one memory block, a plurality of row selectors 120 each associated to one memory 110, and a plurality of write data generators 140 each also associated to one memory 110. Further, there is provided a searching and processing device 1010 receiving read-out signals from even columns 151 and odd columns 151' of each memory 110 so as to output search result signals 152 indicating if the received signals shows the identity or similarity to the search information under the search condition specified by the reference signal 102. These search result signals 152 are supplied and temporarily held in a register array 1020 comprising parallel-arranged registers of the same number as that of the search result signals 152. Outputs of the register array 1020 are connected in parallel to a encoder 162 having a search address outputting bus 162, which is connected to a decoder 1030. This decoder 1030 operates to apply a reset signal 1031 to a register in the register array 1020 specified by the search address of the encoder 160. In addition, a column selector 132 receives a registration address 132 and selectively drives one of column selection lines 131 of each memory 110. As for the row selector 120, the column selector 130 and the write data generator 140, the same ones as used in the CAM shown in FIG. 1 can be used.

If such a CAM has a memory capacity of N words by M×K bits, each memory 110 can be constructed with memory cells arranged in a matrix of $2^M$ rows by 2N columns, that is, a memory of $2^M$ words by 2N bits, and K sets of such memories are necessary. Increase of bit number is realized by inreasing the word number in the CAM of FIG. 7, while in the present CAM, the bit number is increased by increasing the number of the memories 110. Therefore, each block in the memory 110 in the CAM of FIG. 7 correspond to each memory 110 of the present CAM. Search information and store information having the length of M×K bits are divided into K pieces of M bit data 101, which are then applied in parallel to the K row selectors 120 and the K write data generators 140. FIG. 10 is an illustration for K=3.

In the store operation of the CAM show in FIG. 10, the information to be stored is applied as three divided data pieces 101. Each piece of input data 101 is stored and registered in each memory 110 in such a manner as shown in FIG. 2.

In the search operation, data stored in one column of each memory 110 specified by the search information (input data) 101 are applied to the searching and processing device 1010 as even column read-out signals 151 and odd column read-out signals 151'. The searching and processing device 1010 examines the read-out signals 151 and 151' to determine if the stored data is identical or similar to the search information under the search condition specified by the reference signal 102, and then applies the results as search result signals 152 to the N registers of the register array 1020, respectively. The register array 1020 stores the search result signals 152 in synchronism with the clock signals 712. Specifically, in each register of the register array 1020, "1" is inputted and stored when the information stored in the corresponding pair of adjacent columns of the memory 110 is equal to the search information (input data) 101, while "0" is inputted and stored otherwise. If "1" is stored in one register in the register array 1020, the encoder 160 outputs a coincidence signal 161 and supplies the search address 162 representive of the locaton of the register storing "1". The search address 162 thus outputted indicates the address of the information which has been searched on the basis of the search information under the search condition specified by the reference signal 102, similarly to the CAMs shown in FIGS. 1 and 7. In other words, the search address 162 shows the address of the information which is the same as the search information or separate from the search information the Hamming distance 1.

In case of multiple matching where the data stored at a plurality of addresses fulfill the identity or similarlity under the search condition specified by the reference signal, "1" is stored in a plurality of registers in the register array 1020. In this situation, the encoder 160 is adapted to encode the position of the registers storing "1" in the order of the highest place register to the lowest place register or vice versa. In addition, a reset signal 1031 is applied to the decoder 1030, so that the decoder 1030 resets the register 1021 specified by the search address 162. As a consequence, the encoder 160 outputs the next search address 162. Thus, in the multiple matching, all the search addresses are successively outputted to an external apparatus by continuously supplying the reset signal 1031 until the coincidence signal becomes "0".

As explained above, the CAM of FIG. 10 is capable of expanding the bit number of search information and store information without remarkably increasing the memory capacity of the memory 110. THe CAM is also capable of performing the search operation for data having the Hamming distance "1" from the search information as well as the search operation for data identical with the search information. Multiple matching processing can be also achieved. Furthermore, while the CAM shown in FIG. 7 sequentially processes the storing or the searching of long bit length information by dividing it into a plurality of data pieces, the CAM shown in FIG. 10 has an advantage capable of executing in parallel the storing and searching operations for a long bit length information by dividing the information into a plurality of data pieces. Therefore, in the CAM of FIG. 10, the search operation can be done with only one simultaneous access to all the memories 110, so that a higher speed operation can be realized.

Figure 11:
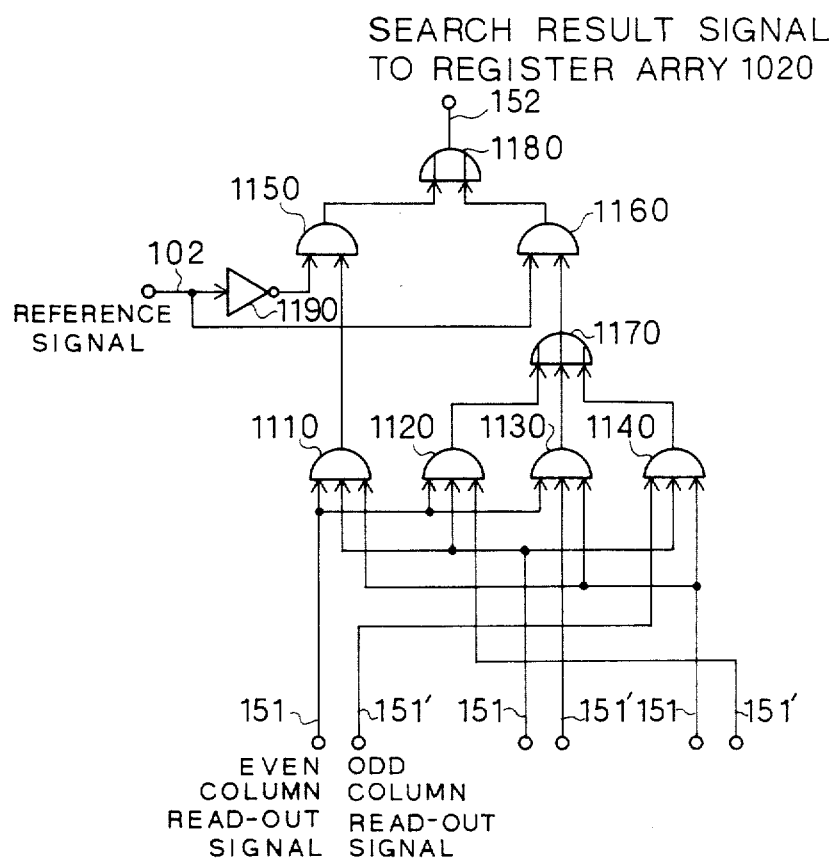
FIG. 11 shows an embodiment of the searching and processing device shown in FIG. 10.

FIG. 11 shows an embodiment of the searching and processing device 1010 used in the CAM shown in FIG. 10. The shown circuit is a fundamental unit of the searching and processing device for generating one search which unit comprises six AND gates 1110, 1120, 1130, 1140, 1150 and 1160, two OR gates 1170 and 1180, and an inverter 1190, which are connected as shown in FIG. 11. This searching and processing unit receives read-out signals from the same even-numbered columns 151 and the same odd-numbered columns 151' of all the memories and the reference signal 102. Therefore, the shown searching and processing unit has to be equipped for each pair of adjacent columns of the three memories 110.

Supposing that the read-out signals 151 from the same specified even-numbered columns of K memories 110 are $EV_0 \ldots EV_i \ldots EV_{k-1}$ and that the read-out signals 151' from the same odd-numbered columns of the K memories 110 adjacent to the above even-numbered columns are $OD_0 \ldots OD_i \ldots OD_{k-1}$, the coincidence result E and Hamming result H are obtained from the formulae (1) and (2), respectively. If we put K=3 as shown in FIG. 10, the coincidence result E and the Hamming result H are represented as follows:

$$E = EV_0 \cdot EV_1 \cdot EV_2 \quad (3)$$

$$H = EV_0 \cdot EV_1 \cdot OD_2 + EV_0 \cdot OD_1 \cdot EV_2 + OD_0 \cdot EV_1 \cdot EV_2 \quad (4)$$

The AND gate 1110 performs the logical operation of the formula (3) and outputs the coincidence result E. The AND gates 1120, 1130 and 1140 and the OR gate 1170 cooperate to perform the operation of the formula (4) and to output the Hamming result H. Either of these results is selectively outputted as the search result signal 152 by a gate circuit which is composed of the AND gates 1150 and 1160, the OR gate 1180 and the inverter and is controlled by the reference signal 102.

The searching and processing shown FIG. 9 performs successively the logical operations of the formulae (1) and (2) in synchronism with the clock signal 712s, while the searching and processing device of FIG. 11 performs the operations shown in the formulae (3) and (4) in parallel.

Figure 12:
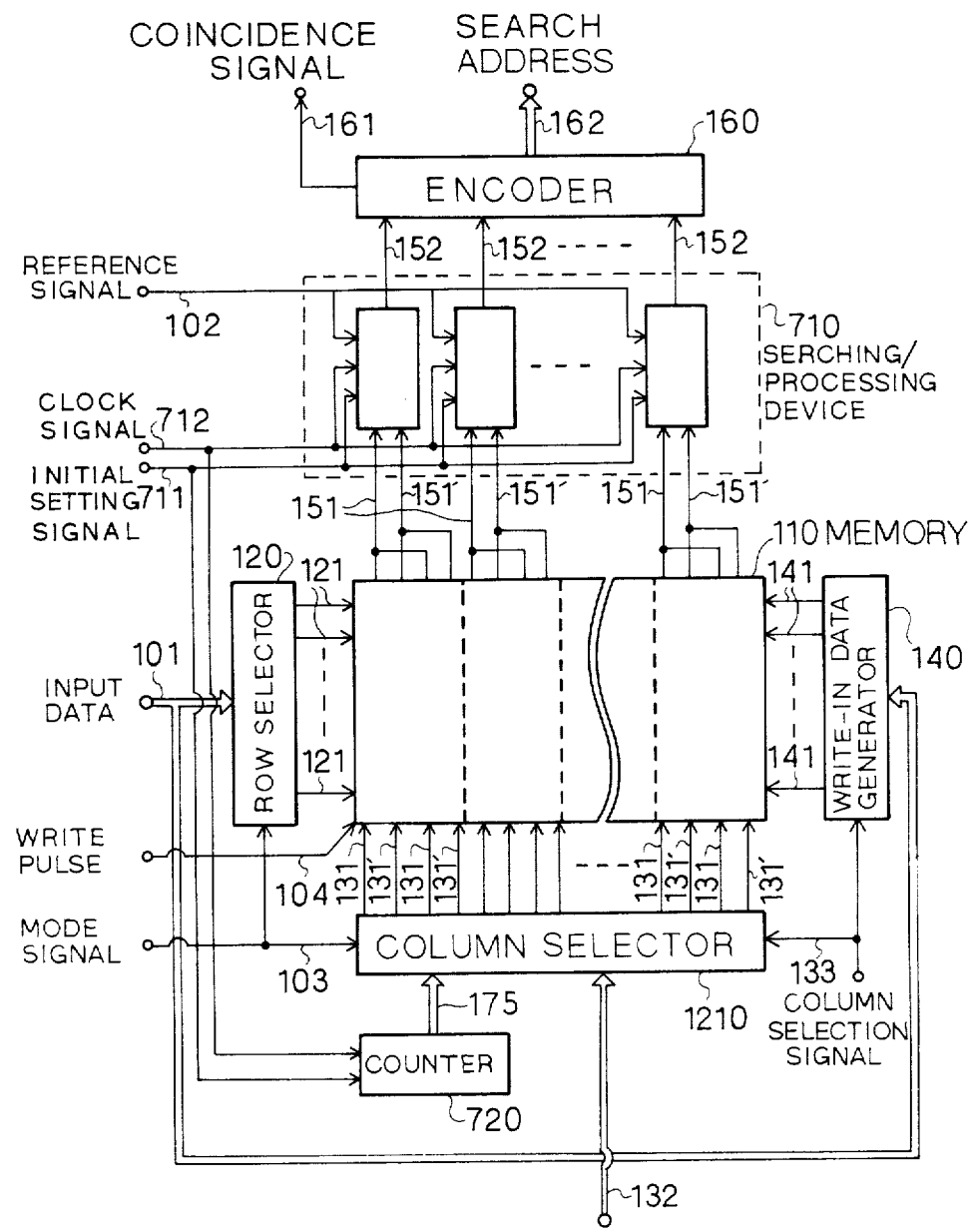
FIG. 12 is a block diagram showing an embodiment of a CAM according to the fourth aspect of the present invention.

FIG. 12 shows an embodiment of a CAM according to a fourth aspect of the present invention. In the CAM shown in FIG. 7 or in FIG. 10, extension of the bit number of the information being processed is realized by increasing the word number of the memory 110 or the number of memories 110; in the present CAM, the column number or the bit number of the memory 110 is directly increased. For this purpose, the column number of the memory 110 is increased to 2NK and an extended column selector 1210 is introduced. In addition to this feature, a counter 720 for counting input data is coupled to the column selector 1210.

If the present CAM has the memory capacity of N words by $M \times K$ bits, the memory 110 is constructed with a conventional memory cells arranged in a matrix of $2^M$ rows by $2 \times N \times K$ columns. That is, the memory 110 has the memory capacity of $2^M$ words by $2 \times N \times K$ bits, and the bit number of the counter 1210 becomes $\log_2 K$ bits. The memory 110 is divided into N blocks, each block having 2K columns shown by a broken line. Each block corresponds to one word of the CAM specified by a registration address 132. Search information and store information of $M \times K$ bits are respectively divided into K pieces of M bit data 101, and are successively inputted in K times in the order of the MSB data piece to the LSB data piece. The store information divided into K pieces of data 101 is stored as a whole in one block specified by the registration address 132 in such a manner that each piece of data is stored in the corresponding predetermined pair of adjacent columns in the same block.

The store operation and search operation of the CAM shown in FIG. 12 are the same as those for the CAM shown in FIG. 7, except for the following two points: partial data of the store information are stored in the direction of column of the memory 110, and the read-out signals 151 and 151' based on partial data of the search information are obtained by scanning in the direction of column. The count output 175 of the counter 720 is supplied to the column selector 1210 to specify adjacent two columns in each block of the memory 110. The count value of the counter 720 is incremented for each inputted partial data as the input data 101. Therefore, in the store operation, the column selector 1210 drives an even column selection line 131 and then the adjacent odd column selection line 131' in a block specified by registration address 132 for one inputted partial data, and repeats such driving operation for every inputted partial data while shifting the pair of adjacent even and odd columns to be driven.

In the search operation, on the other hand, the column selector 1210 drives in parallel the adjacent even and odd two column selection lines 131 and 131' of all the memory blocks specified by the counter 720 for every inputted partial data. Therefore, since the counter 720 is incremented for each inputted partial data, the pair of adjacent even and odd columns to be driven in each memory block are successively shifted in the direction of column. In addition, the columns of the memory 110 connected to not-driven column selection lines 131 and 131' are maintained in a high impedance state, and so, data in only adjacent two columns connected to the column selection lines being driven, are outputted successively to the searching and processing device 710 for every inputted partial data of the search information.

As for the row selector 120, the write data generator 140, the search and processing device 710 and the encoder 160, the same ones as those used in the CAM shown in FIG. 7 can be employed.

As explained above, a CAM having a memory capacity of N words by $M \times K$ bits can be constructed using a conventional memory of $2^M$ words by 2NK bits. In view of the fact that the CAM shown in FIG. 1 requires a conventional memory of $2^{M \times K}$ words by 2N bits for the purpose of having the same memory capacity, the present CAM can be constructed with a memory of a smaller memory capacity, and therefore, is very inexpensive. It is another advantage that the CAM is also capable of carrying out the search operation for data having the Hamming distance 1 from the search information as well as search operation for data identical with the search information.

Figure 13:
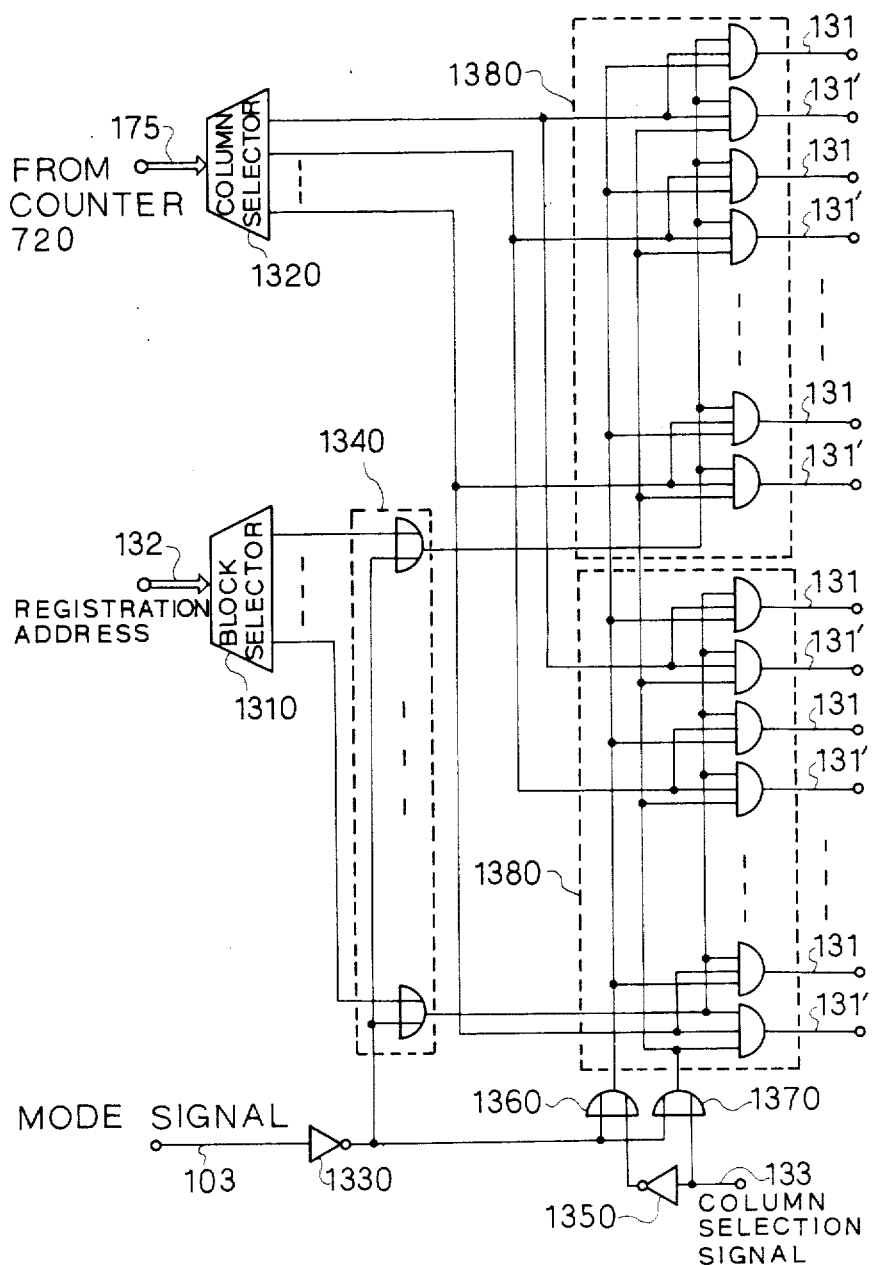
FIG. 13 shows an embodiment of the column selector shown in FIG. 12.

FIG. 13 shows an embodiment of the column selector 1210 used in the CAM shown in FIG. 12. This column selector comprises a block decoder 1310 receiving the registration address 132, and a column decoder 1320 receiving the output from the counter 720. The block decoder 1310 includes a plurality of parallel output lines and operates to selectively drive one of the associated output lines designated by the registration address 132. The output lines of the block decoder 1310 are respectively connected in one-to-one relation to one inputs of two-input OR gates which are arranged in parallel to form an OR gate array 1340. The other input of each OR gate in the gate array 1340 is supplied with the operation mode signal 103 via an inverter 1330, and outputs of all the OR gates are connected in one-to-one relation to AND gate arrays 1380, each of which is associated to one of the memory blocks. On the other hand, the column decoder 1320 comprises a plurality of parallel output lines and selectively drives one of the associated output lines specified by the count output 175 of the counter 720. In addition, each output of the column decoder 1320 is supplied to all the AND gate arrays 1380. Further, the output of the inverter 1330 is connected to one inputs of two OR gates 1360 and 1370, respectively. One of the OR gates 1360 is connected at its other input to an output of another inverter 1350 receiving the column selection signals 133, and the other input of the other OR gate 1370 is connected to directly receive the column selection signal 133. Outputs of the two OR gates 1360 and 1370 are respectively supplied to all the AND gate arrays 1380.

Each of the AND gate arrays 1380 comprises parallel arranged three-input AND gates of two times the number of the output lines of the column decoder 1320. In each AND gate array, first inputs of all the AND gates are connected to the output of the corresponding one OR gate in the OR gate array 1340. Each pair of adjacent AND gates are connected at their second input in common to one corresponding output line of the column decoder 1320. One AND gate of each AND gate pair, i.e., each even-numbered AND gate has a third input connected to the output of the OR gate 1360 and an output connected to an even column selection line 131. The other AND gate of each AND gate pair, i.e., each odd-numbered AND gate is connected at its third input to the output of the OR gate 1370 and at its output to an odd column selection line 131'.

In the search operation, since "0" is applied as the operation mode signal 103, "1" is outputted from the OR gates 1340, 1360 and 1370. Then, one pair of the pairs of column selection lines 131 and 131' coupled to each block of the memory 110 specified by the column decoder 1320 are driven in parallel.

In the store operation, "1" is applied as the operation mode signal 103. Therefore, the block decoder 1310 selects one of the AND gate arrays 1380 on the basis of the registration address 132, and the column decoder 1320 further selects one pair of the pairs of adjacent AND gates in the designated AND gate array in accordance with by the count output 175 of the counter 720. The OR gates 1360 and 1370 cooperate to select either of the selected pair of adjacent AND gates with reference to the column selection signal 133, so that the even and odd column selection lines 131 and 131' respectively connected to the outputs of the selected pair of adjacent AND gates are selectively and sequentially driven in the mentioned order. Thus, it is allowed to write data in one pair of columns in the memory connected to the pair of even and odd column selection lines 131 and 131' so driven.

Figure 14:
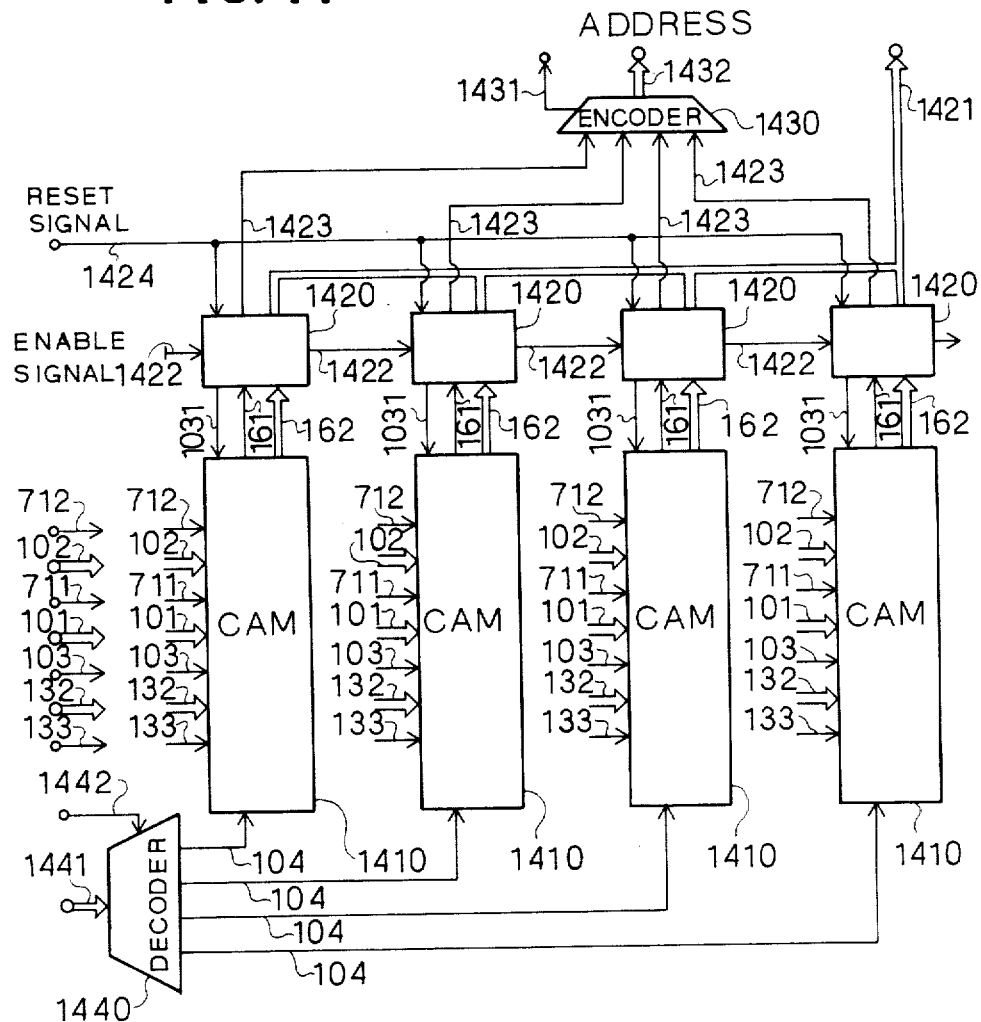
FIG. 14 is a block diagram showing an embodiment of a CAM according to a fifth aspect of the present invention.

FIG. 14 shows an embodiment of a CAM according to a fifth of the present invention. The present CAM, aiming at large memory capacity, comprises a plurality of CAM units 1410 corresponding to the CAM shown in FIGS. 1, 7, 10 and 12, a plurality of data outputting device 1420 receiving data from the plurality of CAM units 1410, an encoder 1430 receiving data from the plurality of data outputting devices 1420 and a decoder 1440 for applying write timing pulses 104 to each CAM unit 1410. The clock signal 712, the reference signal 102, the initial setting signal 711, the input data 101, the operation mode signal 103, the registration address 132 and the column selection signal 133 are applied in parallel to all the CAM units 1410.

The present CAM is capable of processing multiple matching when a plurality of information specified by the search information under the condition of the reference signal are stored in the memory. In the following, explanation will be mode on multiple matching processing. In order to use the CAMs shown in FIGS. 1, 7 and 12 as a CAM unit 1410, a few components must be further equipped to the CAMs. The CAM shown in FIG. 1 must be equipped with a register receiving the search result signal 152. Further, the CAMs shown in FIGS. 1, 7 and 12 must be equipped with a decoder receiving the search address 162 and applying a reset signal to the register or the searching and processing device 710 specified by the search address. In multiple matching operation, if the reset signal is applied from the decoder to the register or to the searching and processing device, the search result signal 152 corresponding to the search address 162 so far outputted is cleared. As a result, the encoder 162 generates the next search address 162, enabling multiple matching processing. The CAM capable of processing multiple matching of data as explained above is used as each CAM unit 1410.

In the store operation, the operation mode signal 103 of "1", the initial setting signal 711, the column signal 133, the clock signal 712, the input data 101 and the registration address 132 are applied to each CAM unit 1410, similarly to the CAM shown in FIGS. 1, 7, 10 and 12. The registration address is divided into a low order resistration address 132 and a high order registration address 1441: the formar is supplied to each CAM units and the latter is applied to the decoder 1440. The high order registration address 1441 specifies one of the CAM units 1410, while the registration address 132 specifies words in the CAM units 1410. A wrote signal 1442 instructing the write operation of data to the CAM is applied to the decoder 1440, which then selectively applies the write timing signal 104 to the CAM unit 1410 specified by the order order registration address 1441. By means of the decoder 1440, information is stored in the CAM unit specified by the high order registration address 1441.

In the search operation, the clock signal 712, the reference signal 102, the initial setting signal 711, the input data 101 and the operation mode signal 103 are applied in parallel to each CAM unit 1410. From the CAM units 1410 storing the data specified by the search information (input data) 101 under the condition of the reference signal 102, the coincidence signal 161 of "1" is outputed together with the search address 162. When "1" is outputted as the coincidence signal 161 from a plurality of CAM units 1410, the CAM units are given a priority order from right to left, so that the data outputting device 1420 outputs the search address 162 in the order from high order CAM unit 1410. In order to establish such a priority order of CAM units, an enable signal 1422 of "1" is applied to the data outputting device 1420 of the highest order or the leftmost CAM unit and at the same time each data outputting device 1420 supplies an enable signal to the adjacent right-side data outputting device. When the data outputting device 1420 receives the enable signal of "1", if it also receives the coincidence signal 161 of "1", it operates to output the search address 162 to an address bus 1421 and at the same time supplies an enable signal of "0" to the adjacent left-side data output device 1420. But, if the data outputting device 1420 receives the coincidence signal of "0" when it receives the enable signal of "1", it supplies the enable signal of "1" to the adjacent right-side data output device 1420. Further, if the data outputting device 1420 receives the enable signal of "0", it operates to put an internal output buffer for the search address in a high impedance state, irrespectively of the condition of the coincidence signal 161, and at the same time to supply the enable signal of "0" to the right-side device. Therefore, all the data outputting devices positioned at the right of the data outputting device which supplies the search address 162 to the bus 1421, maintain their internal output buffer in a high impedance state.

Further, the data outputting device 1420, outputting the search address 162, also outputs the coincidence signal 161 of "1" as the first coincidence signal 1423 to the encoder 1430, while, all the data outputting devices 1420 excluding the data outputting device 1420 outputting the search address, generate the first coincidence signal 1423 of "0" to the encoder 1430. The encoder 1430, receiving these first coincidence signals 1423, generates a second coincidence signal 1431 indicating whether or not "1" is inputted as the first coincidence signal 1423, and also produces a high order search address 1432 indicating the location of the first coincidence signal 1423 of "1". The second coincidence signal 1431 indicates that the data specified by the search information under the condition of the reference signal is stored in the CAM. The high order search address 1432 indicates the location of the CAM unit where the desired data is stored. The low order search address 1421 indicates the search address 162 of the CAM unit, that is, the position of column of the memory storing the desired data.

External apparatus (not shown) watches the second coincidence signal 1431, and reads the high order search address 1432 and the low order search address 1421, and also applies a first reset signal 1424 to each data outputting device 1420. The first reset signal 1424 makes it possible to obtain the the search address corresponding to the next higher priority order information when a plurality of information identical with the search information are stored in the CAM. The data outputting device 1420, outputting the search address 162, responds to the first reset signal 1424 to supply a reset signal 1031 to the associated CAM units 1410, so that it outputs the next search address 162.

As explained above, the present CAM can be constructed with the CAMs shown in FIGS. 1, 7, 10 and 12. Therefore, extension of the word number is easily realized to provide a large memory capacity CAM.

Figure 15:
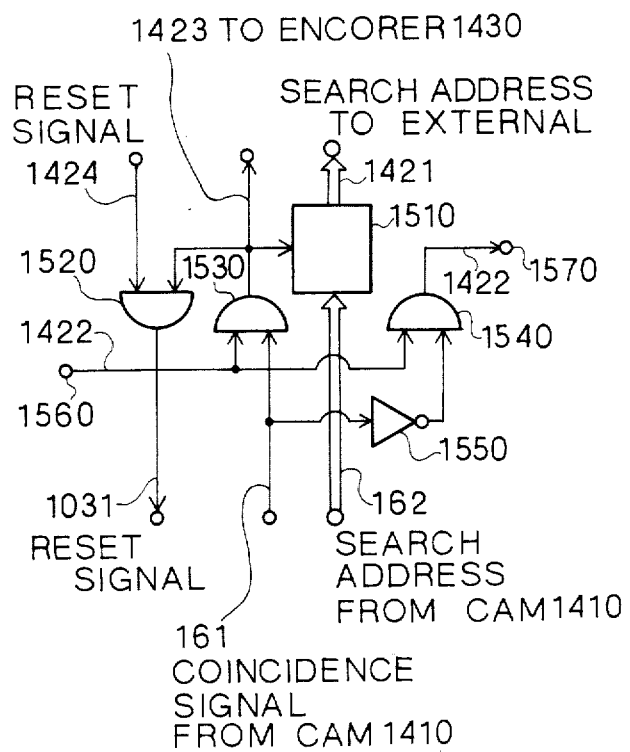
FIG. 15 shows an embodiment of the data outputting device shown in FIG. 14.

FIG. 15 is an illustration of the data outputting device 1420 used in the CAM shown in FIG. 14. The data outputting device comprises an output buffer 1510, three AND gates 1520, 1530 and 1540 and an inverter 1550, which are connected as shown.

When both the coincidence signal 161 and the enable signal 1422 inputted to an enable signal input terminal 1560 from the left side data outputting device 1420 are "1", the AND gate 1530 outputs a signal of "1" as the first coincidence signal 1423, and controls the output buffer 1510 so that the search address 162 is outputted through the output buffer 1510 as the low order search address 1421. Further, the AND gate 1540 outputs the enable signal of "0" to an enable signal output terminal 1570, which will be connected to the enable signal input terminal of the right side data outputting device 1420. Therefore, the output buffer 1510 of the right side device 1420 is brought into a high impedence state. Further, the first reset signal 1424 passes through the AND gate 1520 and is applied as reset signal 1031 to the associated CAM unit. In all the data outputting device 1420 located at the each side of the data outputting device 1420 generating "1" as the first coincidence signal 1423, the first reset signal 1424 does not pass through the AND gate 1520 and therefore does not output the reset signal 1031.

As explained in detail so far, a CAM according to the present invention can be constructed with inexpensive cionventional memory devices accessed by applying the address indicating the location of desired data. The CAM shown in FIG. 1 having a memory capacity of N words by M bits can be constructed by using a conventional memory of $2^M$ words by 2N bits as the memory 110. The CAMs shown in FIGS. 7, 10 and 12 having a memory capacity of N words by M×K bits can be constructed with a conventional memory of $2^M \times K$ words by 2N bits or $2^M$ words by 2NK bits or with K pieces of conventional memories having $2^M$ words by 2N bits. Therefore, using a 1 Mbit memory chip, the following CAMs can be constructed with only one chip: a CAM having 512 words by 10 bits as shown in FIG. 1 or, supposing the input data 101 of 6 bits and the search information divided into eight pieces (k=8), a 48 kilo-bits CAM with 1 kilo-words by 48 bits as shown in FIGS. 7, 10 and 12. Examining CAMs available in the market, for example, CAM "IC 8220" commercially available from Signetics Corporation has a memory capacity of 4 words by 2 bits. Therefore, it is apparent that a CAM according to the present invention has a remarkably large memory capacity.

Search operation and store operation in the CAM can be performed only with one or a few accesses to a conventional memory. Therefore, the operation of the CAM can be executed at a speed higher than those realized in the conventional CAM of the word-serial/bit-parallel type and the word-parallel/bit-serial type. Further, it is possible to carry out the search operation by masking a part of search information, and also to perform the multiple matching processing when desired data are stored in a plurality of addresses. Extension of the memory capacity can be also easily realized. Not only search operation by under the coincidence condition but also search operation within a specified Hamming distance can be performed.

In summary, according to the present invention, a high operation speed, large memory capacity, low priced, multiple function CAM can be realized. If such a CAM is applied to a memory of an information processing system such as data base, pattern recognition and artifical intelligence, the system can perform a high speed associative processing and comparison operation.

In the embodiments mentioned hereinbefore, for even number columns of the memory 110, "1" is stored only in one row specified by the store information, and for odd number columns of the memory 110, "1" is stored in rows specified by data having Hamming distance "1" from the store information. This is only an example of data store. There are many other methods of storing data. As for Hamming distance, a variety of distances can be chosen. For example, "1" can be stored in rows specified by all data within a predetermined Hamming distance. Data of different Hamming distances may be stored in a plurality of columns in such a manner that all the data of the same Hamming distance are stored in the same column. Further, Hamming distance can be specified at the beginning of store operation. In the above embodiments, information is stored in one pair of adjacent columns of the memory 110, but the two columns need not to be adjacent each other. As explained above, changes and modifications are also possible for the write data generater 140, the searching and processing device 710 and the column selections 130 and 1210.

The number of input/output terminals can be reduced by using the same terminals for the registration address bus 132 and the search address bus 162.

Therefore, the inventions are in no way limited to details of the illustrated structures.

We claim:

1. A content-addressable memory device for searching the address of an input data to be searched, said content-addressable memory device comprising:
   memory means including a matrix of memory cells including a plurality of pairs of columns, the row position of each of the memory cells corresponding to the content of the data, the position of each of the pairs of columns corresponding to the address the first column of each pair of columns being for storing the data at the exact address and the second column of each pair of columns being for storing the data having a Hamming distance of a predetermined value from the data stored in the first column of the same pair of columns;

row selecting means coupled to said memory means and for selecting a row of the memory cell matrix of said memory means corresponding to the input data to be searched;

and reading means for reading the content of the memory cells belonging to the row selected by the row selecting means and outputting the content of the memory cells of the first or second column of each pair of columns of said selected row sequentially in response to a reference signal.

2. A content-addressable memory device as claimed in claim 1, wherein said reading means includes a plurality of switches each having a pair of inputs coupled respectively with the first column and the second column of the same pair of columns in the matrix of said memory means so as to receive respectively the content of the memory cell of the first and second columns of each pair belonging to the row selected by the row selecting means, and adapted to output the content of the memory cell of at least one column of the first and second columns of each pair belonging to the row selected by the row selecting means; and further including an encoder receiving the output of the reading means and encoding it to an address for at least one of the search data and the data associated therewith.

3. A content-addressable memory device as claimed in claim 2, wherein the row selecting means comprises a decoder receiving the input data to be searched and outputting a signal representing the row of the matrix of said memory means corresponding to the content of said input data.

4. A content-addressable memory device as claimed in claim 1, further comprising:

column selecting means for, in response to an input data to be stored in an input address, selecting a pair of columns of the matrix of said memory means corresponding to said input address;

data writing means for writing the input data to be stored in the first column of the pair of columns of said matrix selected by the column selecting means and the data associated to said input data in the second column of the pair of columns selected by the column selecting means.

5. A content-addressable memory device as claimed in claim 4, wherein the row selecting means comprises:

a decoder receiving an input data to be searched or stored and decoding the data to signals corresponding to the row of the memory cell matrix and representing the row position of the memory cell matrix corresponding to the content of said input data; and a number of OR gates each having two inputs receiving respectively one of the decoded signals and an operation mode signal indicating the store operation or search operation.

6. A content-addressable memory device as claimed in claim 5, wherein the decoded signal corresponding to the row position of the matrix which corresponds to the content of the input data is "1", while the other decoded signals are "0", and the operation mode signal is "1" when the store operation is ordered, while it is "0" when the search operation is ordered.

7. A content-addressable memory device as claimed in claim 4, wherein the column selecting means comprises a decoder means receiving the input address and outputting a signal representing the position of the pair of columns of the matrix of the memory means which corresponds to the input address.

8. A content-addressable memory device as claimed in claim 7, wherein the column selecting means decodes the input address so as to output, in response to a column section signal, a signal corresponding to the first or second column of the pair of columns in the memory cell matrix which corresponds to the input address.

9. A content-addressable memory device as claimed in claim 4, wherein the column selecting means comprises:

a decoder receiving the input address as the upper order signal and a column selection signal as the least significant signal and decoding these signals to signals representing the first or second columns of the pairs of columns corresponding to the input address in accordance with the variation of the column selection signal; and a plurality of OR gates each corresponding to the columns of the memory cells of the memory means and receiving the corresponding decoded signal and an inverted operation mode signal.

10. A content-addressable memory device as claimed in claim 9, wherein the decoded signals representing the first or second column of the pair of the columns of the matrix corresponding to the input address is "1", while the other decoded signals are "0", and the operation mode signal is "1" when the store operation is ordered, while it is "0" when the search operation is ordered.

11. A content-addressable memory device as claimed in claim 4, wherein the data writing means comprises:

a decoder receiving the input data to be stored and decoding it to signals in the same number as that of the rows of the matrix of the memory means;

means for generating signals representing the associated data; and switching means for, in response to a column selection signal, selectively output the signals corresponding to the data or the associated data.

12. A content-addressable memory device as claimed in claim 11, wherein the decoded signal corresponding to the row position corresponding to the content of the input data to be stored is "1", while the other decoded signals are "0".

13. A content-addressable memory device as claimed in claim 12, wherein the column selection signal is "0" when the first column of the pair of columns of the matrix is selected, while the column selection signal is "1" when the second column of the pair of columns of the matrix is selected.

14. A content-addressable memory device as claimed in claim 4, wherein the associated data is the data of which the Hamming distance is 1 from the input data.

15. A content-addressable memory device for searching the addresses of a data to be searched, said content-addressable memory device comprising:

memory means including a matrix of memory cells including a plurality of pairs of columns, the row position of each of the memory cells corresponding to the content of the data, the position of each of the pairs of columns corresponding to the address, the first column of each pair of columns being for storing the data having the exact address corresponding to the position of the pair of columns and the second column of each pair of columns being for storing the data adjacent to the data stored in the first column of the same pair of columns;

row selecting means coupled to said memory means and for selecting a row of the memory cell matrix of said memory means corresponding to the input data to be searched;

reading means for reading the content of the memory cells belonging to the row selected by the row selecting means and outputting the content of the memory cells of the first or second column of each pairs of columns of said selected row sequentially in response to a reference signal; and an encoder receiving the output of the reading means and encoding the content of the memory cells of the first or second column of each pairs of columns in said selected row respectively to the addresses for the input data to be searched or the data associated therewith.

16. A content-addressable memory device as claimed in claim 15, wherein the row selecting means comprises:

a decoder receiving the data and decoding the data to signals corresponding to the rows of the memory cell matrix and representing the row position of the memory cell matrix corresponding to the content of the data; and a number of OR gates each having two inputs receiving respectively one of the decoded signals and an operation mode signal.

17. A content-addressable memory device as claimed in claim 16, wherein the decoded signal corresponding to the row position of the matrix which corresponds to the content of the data is "1", while the other decoded signals are "0", and the operation mode signal is "1" to order the search operation.

18. A content-addressable memory device as claimed in claim 15, further comprising:

column selecting means for, in response to a store operation signal, selecting a pair of columns of the matrix of said memory means corresponding to the input address;

data writing means for writing the input data in the first column of the pair of columns of said matrix selected by the column selecting means and the associated data in the second column of the pair of columns selected by the column selecting means.

19. A content-addressable memory device as claimed in claim 18, wherein the memory cell matrix is of $2^M \times K$ words by 2N bits and is divided into K memory blocks, so that the input data having the length of MK bits is divided into K pieces of M bit data and the K pieces of data are sequentially stored in the same numbered pair of columns in the respective memory block by cooperation of the row selecting means and the data writing means.

20. A content-addressable memory device as claimed in claim 19, wherein the search data has the length of MK bits and is divided into K pieces of search data which are sequentially applied to the row selecting means, wherein the row selecting means operates to sequentially selecting the respective rows of the K memory blocks corresponding to the K pieces of search data, respectively, and wherein the reading means is a processing means reading the outputs of all the columns of the memory cell matrix for each application of the K pieces of search data and sequentially accumulating the outputs read out at the applications of the K piece of search data for every pair of columns so as to supply the accumulated read-out outputs to the encoder.

21. A content-addressable memory device as claimed in claim 18, wherein the memory means includes a K memory cell matrixes each being $2^M$ words by 2N bits, each memory cell matrix being associated with a row selecting means and a data writing means so that the input data having the length of MK bits is divided into K pieces of data and the K pieces of data are stored in parallel in the same pair of columns in the respective memory cell matrixes by cooperation of the row selecting means and the data writing means associated to each memory cell matrix.

22. A content-addressable memory devices as claimed in claim 21, wherein the search data has the length of MK bits and is divided into K pieces of search data which are simultaneously applied to the respective row selecting means, wherein the respective row selecting means operate to simultaneously selecting the respective row of the K memory cell the K memory cell matrixes corresponding to the K pieces of search data, respectively, and wherein the reading means is a processing means simultaneously receiving the outputs of all the columns of the K memory cell matrixes and examining if the outputs of the same numbered column of the respective memory cell matrixes fulfill as a whole the search condition, so as to supply the search result to the encoder for each column.

23. A content-addressable memory device as claimed in claim 18, wherein the memory cell matrix is of $2^M$ words by 2NK bits and is divided into N memory blocks each having 2K columns, so that the input data having the length of MK bits is divided into K pieces of M bit data and the K pieces of data are sequentially stored in the respective pairs of columns in one memory block designated by the input address.

24. A content-addressable memory device as claimed in claim 23, wherein the search data has the length of MK bits and divided into K pieces of search data which are sequentially applied to the row selecting means, wherein the row selecting means responds to each application of the K pieces of search data to select the one row of the memory cell matrix corresponding to the applied search data piece and the column selecting means operates to respond to each application of the K search data pieces so as to incrementally select the columns of each memory block, and wherein the reading means is a processing means reading the outputs of the columns of each memory block selected by the column selecting means for each application of the K search data pieces and to sequentially accumulating the outputs read out from each memory block at the application of the K search data pieces so as to supply the search result to the encoder.

25. A content-addressable memory device as claimed in claim 15, wherein when the search operation is ordered, the row selecting means puts accessible the row of the matrix of said memory means corresponding to the content of the search data, and when the store operation is ordered, the row selecting means puts accessible all of the row of the matrix of said memory means.

26. A content-addressable memory device as claimed in claim 15, wherein when the store operation is ordered, the column selecting means puts accessible the pairs of columns of the matrix of which the position corresponds to the content of the input address, and when the search operation is ordered, the column selecting means puts accessible all of the columns of the matrix of said memory means.

27. A content-addressable memory device as claimed in claim 26, wherein the column selecting means puts accessible, in response to a column selection signal, the first or second columns of the pair of columns in the memory cell matrix corresponding to the input address.

28. A content-addressable memory device as claimed in claim 27, wherein the column selecting means comprises:
  a decoder receiving the input address as the upper order signal and a column selection signal as the least significant signal or decoding these signals to signals representing the first and second columns of the pairs of columns corresponding to the input address in accordance with the variation of the column section signal; and
  a plurality of OR gates each corresponding to the columns of the memory cells of the memory means and receiving the corresponding decoded signal and an inverted operation mode signal.

29. A content-addressable memory device as claimed in claim 28, wherein the decoded signals representing the position of the pair of the columns of the matrix corresponding to the input address is "1", while the other decoded signals are "0", and the operation mode signal is "1" when the store operation is ordered, while it is "0" when the search operation is ordered.

30. A content-addressable memory device as claimed in claim 18, wherein the data writing means comprises:
  a decoder for decoding the data to signals representing the row of the memory cell matrix corresponding to the content of the input data;
  means for generating signals corresponding to the associated data; and
  switching means for, in response to a column selection signal, selectively output the signals corresponding to the data or the associated data.

31. A content-addressable memory device as claimed in claim 30, wherein the decoded signal representing the row position corresponding to the content of the data is "1", while the other decoded signals are "0".

32. A content-addressable memory device as claimed in claim 31, wherein the column selection signal is "0" when the first column of the pair of columns of the matrix is to be selected, while the column selection signal is "1" when the second column of the pair of columns of the matrix is to be selected.

33. A content-addressable memory device as claimed in claim 15, wherein the associated data is the data of which the Hamming distance is 1 from the input data.

34. A content-addressable memory device for storing N kinds of data each of M bit length and the data associated therewith with a same address i and for searching the addresses of a search data and the associated data therewith, said content-addressable memory device comprising:
  memory means including a matrix of memory cells of $2^M$ rows by N pairs of columns, in which an input data with an address i is to be stored as the activation of the memory cell belonging to a j-th row corresponding to the content of the input data and to the first column of the i-th pair of columns of the matrix corresponding to the input address i;
  row selecting means coupled to said memory means and for, in response to a search operation signal, selecting the j-th row of the memory cell matrix of said memory means to put accessible the memory cells therein;
  column selecting means for, in response to a store operation signal, selecting the i-th pair of columns of the matrix of said memory means to put accessible the memory cells therein;
  data writing means for writing the input data by activating the memory cell belonging to the first column of the i-th pair of columns of said matrix selected by the column selecting means and the j-th row of said matrix selected by the row selecting means, and for writing the associated data by activating the memory cell belonging to the second column of the i-th pair of columns of said matrix selected by the column selecting means and to the row of the memory cell matrix of which the position corresponds to the content of the associated data;
  reading means for reading the content of the memory cells belonging to the j-th row selected by the row selecting means and outputting the content of the memory cells of the first or second column of each pairs of columns of said selected j-th row sequentially in response to a reference signal; and
  an encoder receiving the output of the reading means and encoding the content of the memory cells of the first or second column of each pairs of columns of said selected j-th row respectively to addresses for the search data or the data associated therewith.

35. A content-addressable memory device as claimed in claim 34, wherein when the search operation is ordered, the row selecting means puts accessible the j-th row of the matrix of said memory means corresponding to the content of the search data, and when the store operation is ordered, the row selecting means puts accessible all of the rows of the matrix of said memory means.

36. A content-addressable memory device as claimed in claim 35, wherein the row selecting means comprising:
  a decoder receiving the data and decoding the data to $2^N$ signals of which the J-th signal is "1" and the other signals are "0"; and
  $2^N$ OR gates each having two inputs receiving respectively one of the decoded signals and an operation mode signal indicating the store operation or search operation.

37. A content-addressable memory device as claimed in claim 36, wherein the operation mode signal is "1" when the store operation is ordered, while it is "0" when the search operation is ordered.

38. A content-addressable memory device as claimed in claim 33, wherein when the store operation is ordered, the column selecting means puts accessible the i-th pair of columns of the matrix of which the position corresponds to the content of the input address, and when the search operation is ordered, the column selecting means puts accessible all of the columns of the matrix of said memory means.

39. A content-addressable memory device as claimed in claim 38, wherein the column selecting means puts accessible, in response to a column selection signal, the first or second column of the i-th pair of columns in the memory cell matrix corresponding to the input address.

40. A content-addressable memory device as claimed in claim 39, wherein the column selecting means comprises:
  a decoder receiving the input address i as the upper order signal and a column selection signal as the least significant signal and decoding sequentially these signals to M pairs of signals including signals representing respectively the first and second columns of the i-th pair of columns; and
  a plurality of OR gates each corresponding to the columns of the memory cells of the memory means and receiving the corresponding decoded signal and an inverted operation mode signal.

41. A content-addressable memory device as claimed in claim 40, wherein the decoded signals representing the position of the pair of the columns of the matrix corresponding to the input address is "1", while the other decoded signals are "0", and the operation mode signal is "1" when the store operation is ordered, while it is "0" when the search operation is ordered.

42. A content-addressable memory device as claimed in claim 35, wherein the data writing means comprises:
a decoder for decoding the data to $2^M$ signals including a signal representing the j-th row of the memory cell matrix corresponding to the input data;
means for moderating said decoded signals to generate $2^M$ signals including a signal corresponding to the content of the associated data; and
switching means for, in response to a column selection signal, selectively output the signals corresponding to the data or the associated data to activate the corresponding memory cell.

43. A content-addressable memory device as claimed in claim 42, wherein the decoded signal representing the row position corresponding to the content of the data is "1", while the other decoded signals are "0".

44. A content-addressable memory device as claimed in claim 43, wherein the column selection signal is "0" when the first column of the pair of columns of the matrix is to be selected, while the column selection signal is "1" when the second column of the pair of columns of the matrix is to be selected.

* * * * *

UNITED STATES PATENT AND TRADEMARK OFFICE
CERTIFICATE OF CORRECTION

PATENT NO. : 4,755,974
DATED : July 5, 1988
INVENTOR(S) : YAMADA, ET AL

It is certified that error appears in the above-identified patent and that said Letters Patent is hereby corrected as shown below:

Column 1, line 48, delete "extreame" and insert --extreme--;

Column 2, line 26, delete "closa" and insert --close--;

Column 3, line 18, delete "original, a"

Column 3, line 49, delete "prefrably" and insert --preferably--;

column 11, line 13, delete "designate" and insert --designated--,

Column 14, line 4, delete "dicimal" and insert --decimal--;

Column 18, line 22, delete "THe" and insert --The--;

Column 22, line 5, delete "fomar" and insert --former--;

Column 22, line 9, delete "wrote" and insert --write--;

UNITED STATES PATENT AND TRADEMARK OFFICE
CERTIFICATE OF CORRECTION

PATENT NO. :  4,755,974

DATED : July 5, 1988

INVENTOR(S) : YAMADA, ET AL

It is certified that error appears in the above-identified patent and that said Letters Patent is hereby corrected as shown below:

Column 23, line 52, delete "cionventional" and insert --conventional--.

Signed and Sealed this

Twenty-first Day of February, 1989

Attest:

DONALD J. QUIGG

*Attesting Officer*   Commissioner of Patents and Trademarks